(12) United States Patent
Jung et al.

(10) Patent No.: US 7,667,266 B2
(45) Date of Patent: Feb. 23, 2010

(54) SEMICONDUCTOR DEVICE INCLUDING ACTIVE PATTERN WITH CHANNEL RECESS, AND METHOD OF FABRICATING THE SAME

(75) Inventors: Kyoung-Ho Jung, Gyeonggi-do (KR); Makoto Yoshida, Gyeonggi-do (KR); Jae-Rok Kahng, Seoul (KR); Chul Lee, Seoul (KR); Keun-Nam Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/116,821

(22) Filed: May 7, 2008

(65) Prior Publication Data

US 2008/0303085 A1  Dec. 11, 2008

(30) Foreign Application Priority Data

Jun. 7, 2007  (KR) ...................... 10-2007-0055682

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 29/00* (2006.01)

(52) U.S. Cl. ...................... 257/330; 257/328; 257/329; 257/331; 257/332; 257/333; 257/334; 257/401; 257/510; 257/E21.546; 257/E21.553

(58) Field of Classification Search ......... 257/328–334, 257/401, 510, E21.546, E21.553
See application file for complete search history.

(56) References Cited

U.S. PATENT DOCUMENTS 5,396,093 A * 3/1995 Lu .............................. 257/306

(Continued)

FOREIGN PATENT DOCUMENTS

KR  2006-0000275  1/2006

(Continued)

OTHER PUBLICATIONS

English language abstract of Korean Publication No. 2006-0000275.

(Continued)

*Primary Examiner*—Ida M Soward
(74) *Attorney, Agent, or Firm*—Volentine & Whitt, PLLC

(57) ABSTRACT

A semiconductor device including an active pattern having a channel recess portion, and a method of fabricating the same, are disclosed. In one embodiment, the semiconductor device includes an active pattern including first active regions and a second active region interposed between the first active regions. The active pattern protrudes above a surface of a semiconductor substrate and includes a channel recess portion above the second active region and between the first active regions. A device isolation layer surrounds the active pattern and has a groove exposing side walls of the recessed second active region. A distance between opposing side walls of the first active regions exposed by the channel recess portion is greater than a distance between side walls of the groove. A gate pattern is located in the channel recess portion and extends along the groove.

18 Claims, 29 Drawing Sheets

U.S. PATENT DOCUMENTS

| | | | |
|---|---|---|---|
| 6,649,975 B2 * | 11/2003 | Baliga | 257/330 |
| 7,170,133 B2 * | 1/2007 | Jang et al. | 257/327 |
| 7,183,600 B2 * | 2/2007 | Kim et al. | 257/295 |
| 7,217,623 B2 * | 5/2007 | Kim et al. | 438/283 |
| 7,247,887 B2 * | 7/2007 | King et al. | 257/139 |
| 7,285,466 B2 * | 10/2007 | Kim et al. | 438/270 |
| 7,384,849 B2 * | 6/2008 | Parekh et al. | 438/270 |
| 7,432,160 B2 * | 10/2008 | Cho et al. | 438/268 |
| 7,442,607 B2 * | 10/2008 | Kim et al. | 438/270 |
| 7,459,358 B2 * | 12/2008 | Lee et al. | 438/197 |
| 7,514,743 B2 * | 4/2009 | Yang | 257/330 |
| 2005/0056888 A1 * | 3/2005 | Youn et al. | 257/331 |
| 2006/0091482 A1 * | 5/2006 | Kim et al. | 257/401 |
| 2008/0079071 A1 * | 4/2008 | Kim | 257/334 |
| 2008/0169493 A1 * | 7/2008 | Lee et al. | 257/296 |

FOREIGN PATENT DOCUMENTS

| | | |
|---|---|---|
| KR | 2006-0029549 | 4/2006 |
| KR | 2006-0130322 | 12/2006 |

OTHER PUBLICATIONS

English language abstract of Korean Publication No. 2006-0029549.
English language abstract of Korean Publication No. 2006-0130322.

* cited by examiner

SEMICONDUCTOR DEVICE INCLUDING ACTIVE PATTERN WITH CHANNEL RECESS, AND METHOD OF FABRICATING THE SAME

CROSS-REFERENCE TO RELATED PATENT APPLICATIONS

This application claims the benefit of foreign priority to Korean Patent Application No. 10-2007-0055682, filed on Jun. 7, 2007, the disclosure of which is incorporated herein in its entirety by reference.

BACKGROUND

1. Field of Invention

Embodiments of the present invention relate to semiconductor devices and methods of fabricating the same, and more particularly, to a semiconductor device having a channel recess portion and a method of fabricating the same.

2. Description of the Related Art

A field effect transistor includes an active region, a gate electrode extending perpendicular to the active region, and source and drain regions formed in the active region at either side of the gate electrode. The active region formed under the gate electrode, between the source region and the drain region, acts as a passage through which charges move when the field effect transistor is turned on. The active region is defined as a channel region.

As the integration of semiconductor devices is increased, the width of the active region and the width of the gate electrode are decreased. A decrease in the width of the gate electrode results in a decrease in the length of the channel region, and thus a short channel effect, such as a drain induced barrier lowering (DIBL) phenomenon, a hot carrier effect, and a punch through effect, occur. In addition, a decrease in the width of the active region results in a decrease in the width of the channel region, and thus a threshold voltage of a transistor is increased, which is called a narrow width effect.

SUMMARY

Embodiments of the present invention are capable of providing a semiconductor device having a small short channel effect and a small narrow width effect, and a method of fabricating such a semiconductor device.

One exemplary embodiment disclosed herein can be generally characterized as a semiconductor device that includes an active pattern comprising first active regions and a second active region interposed between the first active regions, wherein the active pattern protrudes above a surface of a semiconductor substrate and includes a channel recess portion above the second active region and between the first active regions; a device isolation layer surrounding the active pattern and having a groove exposing side walls of the recessed second active region, wherein a distance between opposing side walls of the first active regions exposed by the channel recess portion is greater than a distance between side walls of the groove; and a gate pattern located in the channel recess portion and extending along the groove.

Another exemplary embodiment disclosed herein can be generally characterized as a semiconductor device that includes a semiconductor substrate; an active pattern formed on a surface of the semiconductor substrate, wherein the active pattern comprises a first active region and a second active region; a device isolation layer formed on the surface of the semiconductor substrate adjacent to the first active region and the second active region, wherein the device isolation layer includes a groove; a gate electrode disposed between side walls of the groove, the gate electrode extending over a top surface of the second active region and adjacent to a side wall of the first active region; and a source/drain region formed in a top surface of the first active region.

Yet another exemplary embodiment disclosed herein can be generally characterized as a semiconductor device that includes a semiconductor substrate; an active pattern formed on a surface of the semiconductor substrate, wherein the active pattern comprises: a first active region having a first top surface above the surface of the semiconductor substrate and a first sidewall extending downwardly from the first top surface; and a second active region having a second top surface above the surface of the semiconductor substrate and a second sidewall extending downwardly from the second top surface, wherein the second top surface is below the first top surface; a device isolation region adjacent to the active pattern; and a gate electrode within the device isolation region and over the active pattern, wherein the gate electrode extends along the second sidewall and the second top surface of the second active region and extends along the first sidewall of the first active region, wherein a width of a portion of the gate electrode within the device isolation region is less than a width of a portion of the gate electrode over the active pattern.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION

Figure 1A:
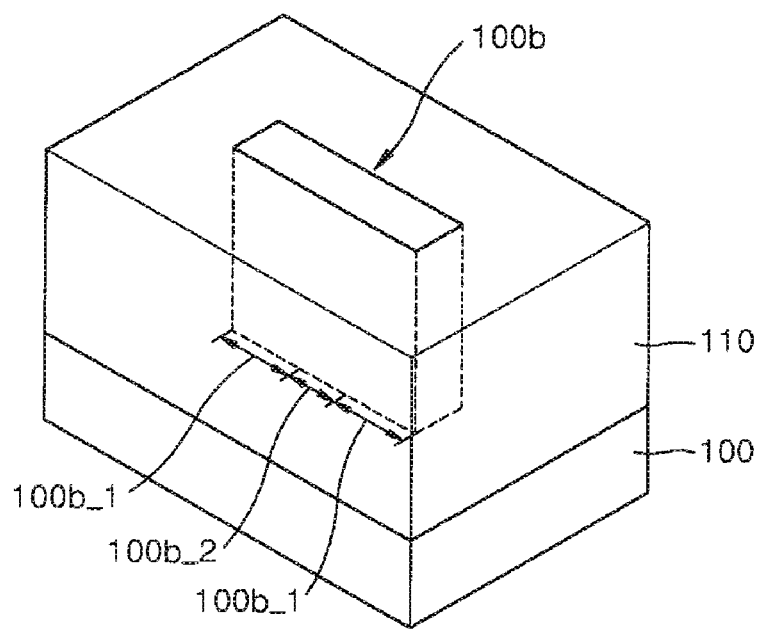
FIGS. 1A through 1I are perspective views sequentially illustrating a method of fabricating a semiconductor device according to an embodiment of the present invention.

Embodiments of the present invention will now be exemplarily described with reference to the accompanying drawings. These embodiments may, however, be realized in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIGS. 1A through 1I are perspective views sequentially illustrating a method of fabricating a semiconductor device according to an embodiment of the present invention. FIGS. 2A through 2I are plan views sequentially illustrating the method of fabricating a semiconductor device respectively corresponding to FIGS. 1A through 1I. FIGS. 3A through 3I are sectional views taken along lines A-A', B-B', and C-C' of FIGS. 2A through FIG. 2I. The views illustrated in FIGS. 1A through 1I, 2A through 2I, and 3A through 3I are limited to a cell array region.

Figure 2A:
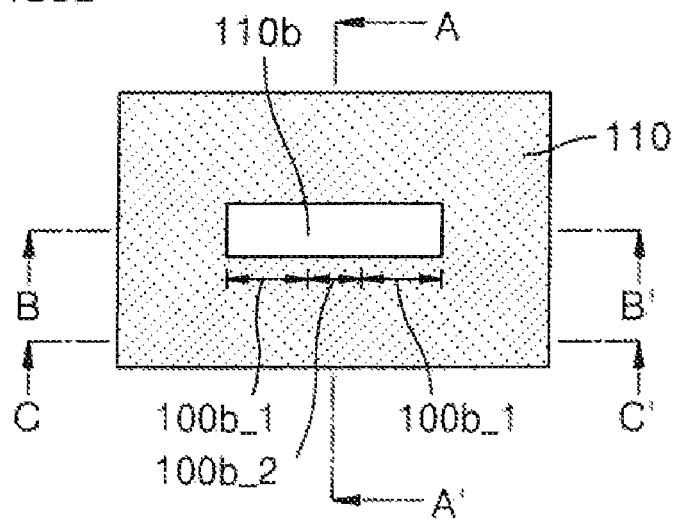
FIGS. 2A through 2I are plan views sequentially illustrating a method of fabricating a semiconductor device according to an embodiment of the present invention.
Figure 3A:
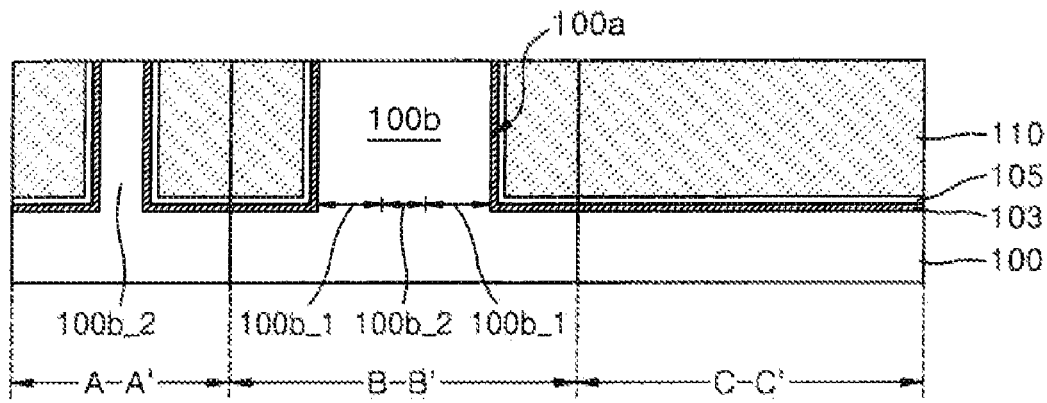
FIGS. 3A through 3I are sectional views taken along lines A-A', B-B', and C-C' of FIG. 2A through FIG. 2I.

Referring to FIGS. 1A, 2A, and 3A, a semiconductor substrate 100 is provided and a device isolation trench 100*a* is formed in the semiconductor substrate 100 to define an active pattern 100*b*. The active pattern 100*b* protrudes from the semiconductor substrate 100. A depth of the device isolation trench 100*a*, that is, a height of the active pattern 100*b* may be in the range from about 2000 to 3500 Å. The active pattern 100*b* includes first active regions 100*b*_1 and a second active region 100*b*_2 interposed between the first active regions 100*b*_1.

A first insulating liner 103 is formed on an inner wall of the device isolation trench 100*a*. The first insulating liner 103 can include, for example, a thermal oxide layer formed by thermally oxidizing the inner wall of the device isolation trench 100*a*. Due to the first insulating liner 103, etch defects formed in the inner wall when the device isolation trench 100*a* is formed can be removed. The first insulating liner 103 may have a thickness from about 30 to 150 Å. A second insulating liner 105 may be formed on the first insulating liner 103. The second insulating liner 105 can include, for example, a silicon nitride layer. A thickness of the second insulating liner 105 may be in the range from about 30 to 150 Å. The first and second insulating liners 103 and 105 are not shown in FIG. 1A and FIG. 2A to simplify the drawings. Also, the first and second insulating liners 103 and 105 are not shown in FIGS. 1B through 1I and 2B through 2I.

A device isolation insulating layer filling the device isolation trench 100*a* is formed on the semiconductor substrate 100 including the first and second insulating liners 103 and 105. Then, the device isolation insulating layer is evenly etched until a top surface of the active pattern 100*b* is exposed, thereby forming a device isolation layer 110. A top surface of the device isolation layer 110 may substantially lie in the same plane as a top surface of the active pattern 100*b*. That is, the top surface of the device isolation layer 110 and the top surface of the active pattern 100*b* may be substantially coplanar. In addition, the active pattern 100*b* may be surrounded by the device isolation layer 110. The device isolation insulating layer may be evenly etched by chemical-mechanical polishing (CMP). The device isolation layer 110 can include, for example, a silicon oxide layer. For example, the device isolation layer 110 can include a high density plasma (HDP) oxide layer.

Figure 1B:
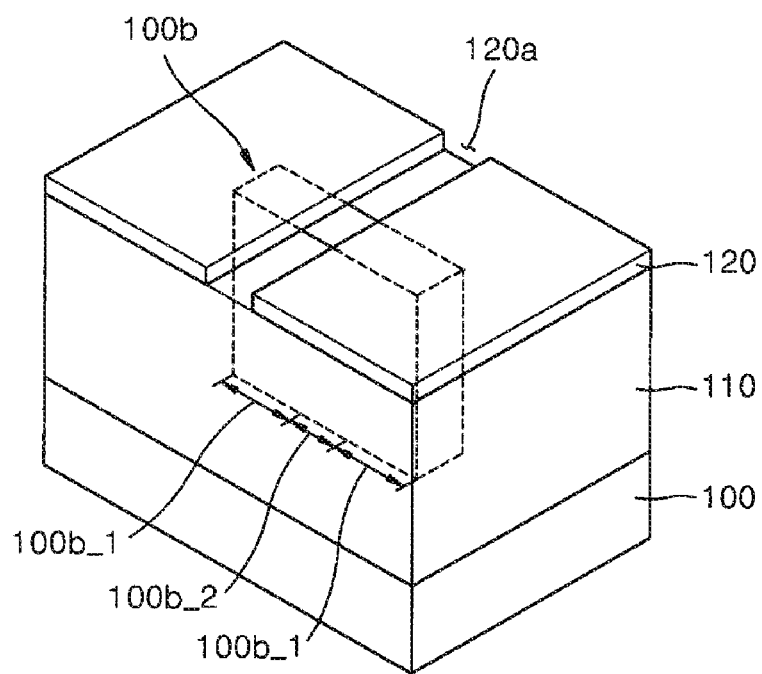
Figure 2B:
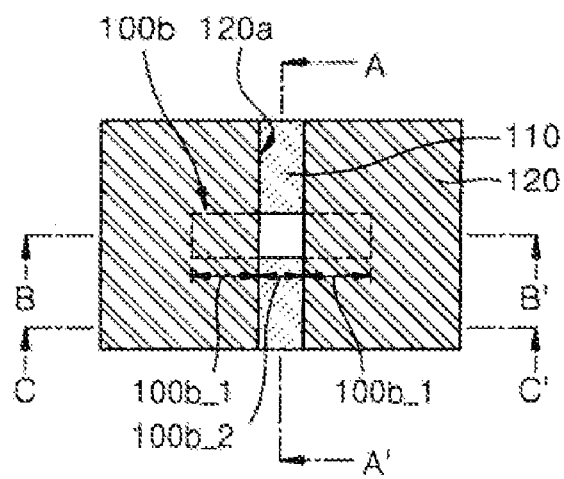
Figure 3B:
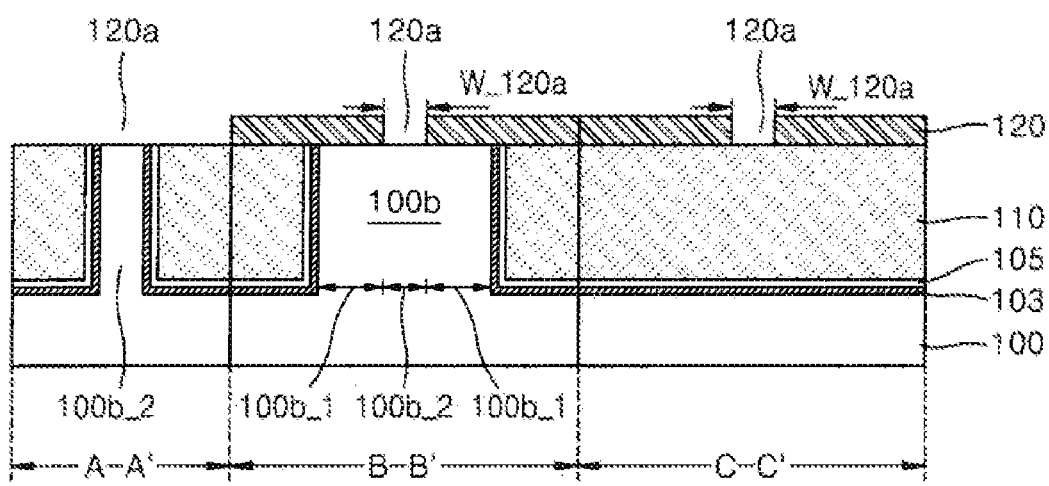

Referring to FIGS. 1B, 2B, and 3B, an etch mask layer is formed on the active pattern 100*b* and the device isolation layer 110, and then patterned to form an etch mask pattern 120 having a slit 120*a* extending so as to cross over the second active region 100*b*_2. For example, the second active region 100*b*_2 is exposed in the slit 120*a*, and the slit 120*a* may cross over the active pattern 100*b* and expose a portion of the device isolation layer 110 adjacent to the second active region 100*b*_2. The slit 120*a* may have a width W_120*a*. In one embodiment, the width W_120*a* is substantially uniform. Accordingly, a portion of the slit 120*a* exposing the second active region 100*b*_2 and a portion of the slit 120*a* exposing the device isolation layer 110 can have the same width W_120*a*.

The etch mask pattern 120 can be formed using a material having etch selectivity with respect to the active pattern 100*b* and the device isolation layer 110. For example, the etch mask pattern 120 can include a silicon nitride layer.

Figure 1C:
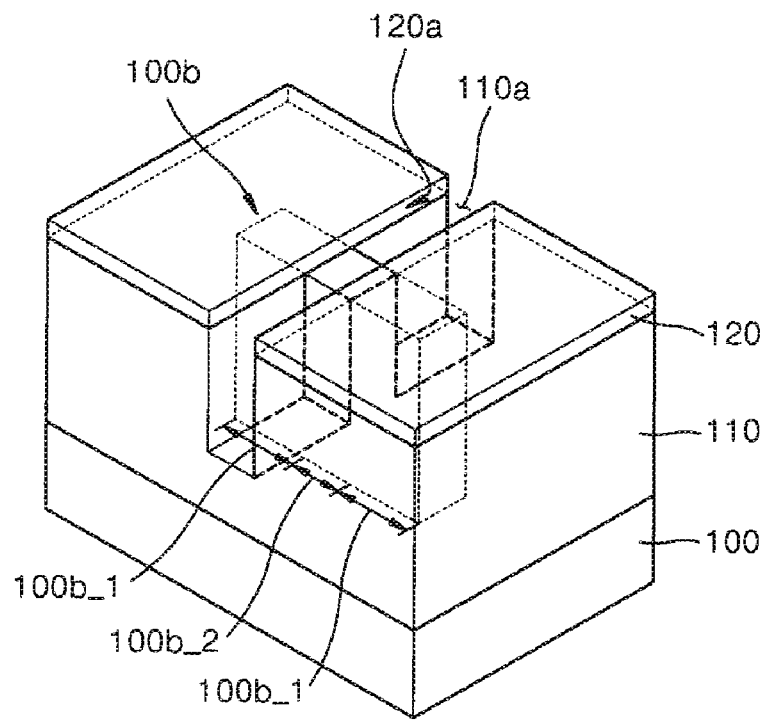
Figure 2C:
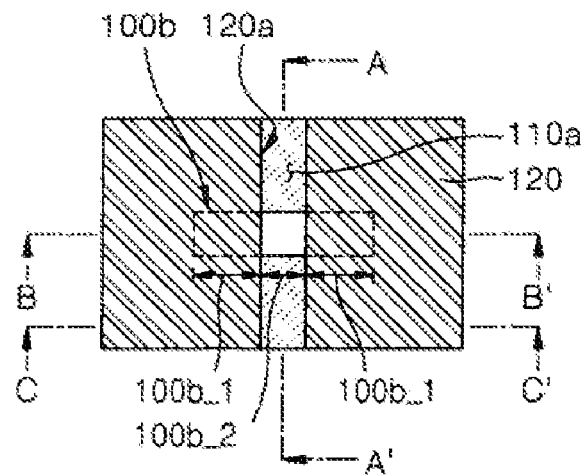
Figure 3C:
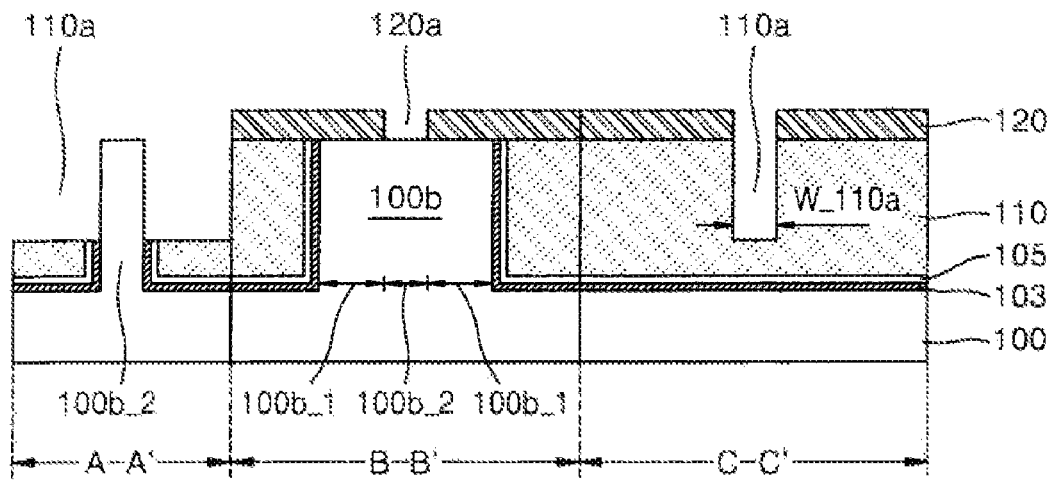

Referring to FIGS. 1C, 2C, and 3C, a top portion of the device isolation layer 110 exposed by the slit 120*a* is etched using the etch mask pattern 120 as a mask to form a groove 110*a*. Upper side walls of the second active region 100*b*_2 are exposed by the groove 110*a*. A width W_110*a* of the groove 110*a* can be substantially the same as the width W_120*a* of the slit 120*a*. The groove 110*a* can be formed by using an anisotropic etching method involving an etch recipe which can be used to selectively remove the device isolation layer 110, that is, an etch recipe which has etch selectivity with respect to the active pattern 100*b* and the etch mask pattern 120.

The first and second insulating liners 103 and 105 have relatively small thicknesses and, therefore, can be removed when the groove 110*a* is formed so that upper side walls of the second active region 100*b*_2 can be exposed. In other embodiments, however, the first and second insulating liners 103 and 105 can be removed in a subsequent process.

Figure 1D:
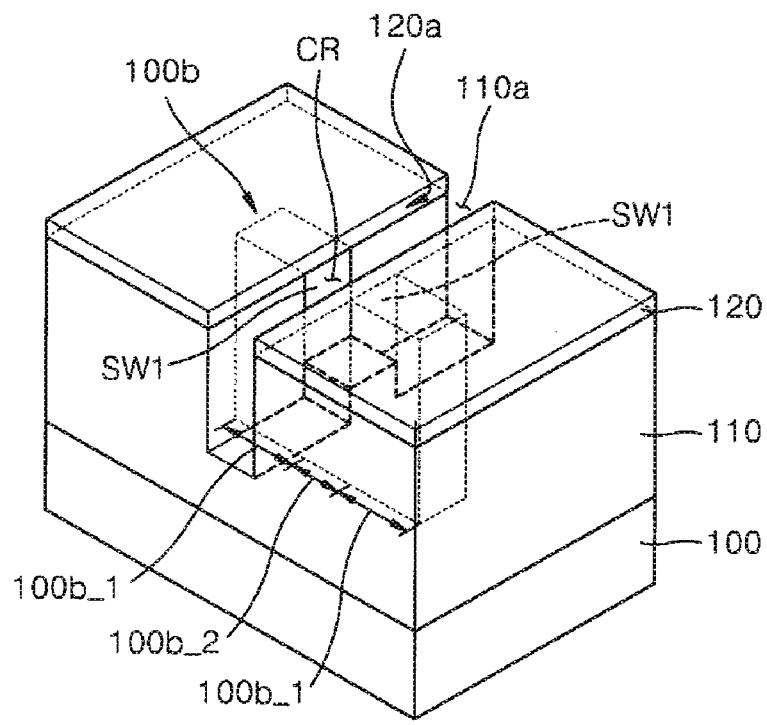
Figure 2D:
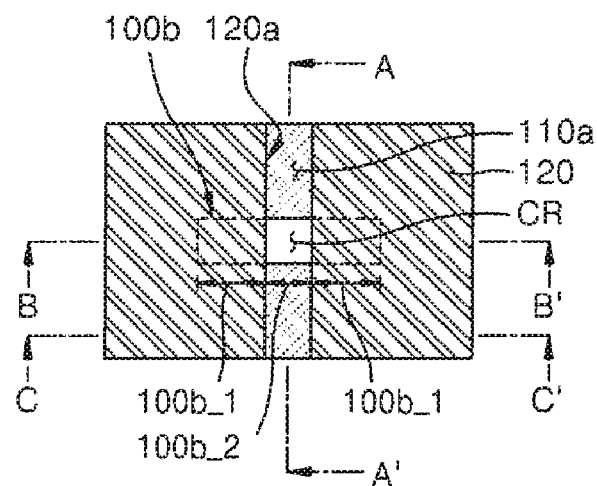
Figure 3D:
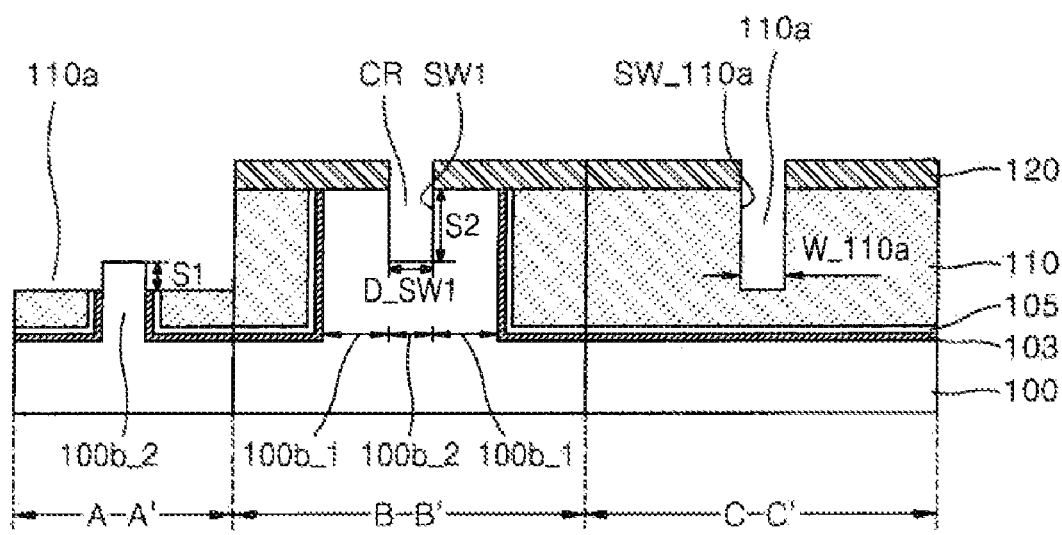

Referring to FIGS. 1D, 2D, and 3D, a top portion of the second active region 100*b*_2 exposed by the slit 120*a* is recessed using the etch mask pattern 120 as a mask to form a channel recess portion CR between the first active regions 100*b*_1. Side walls of the first active regions 100*b*_1 in the channel recess portion CR (i.e., first side walls SW1) are exposed to face (i.e., oppose) each other. A width of the channel recess portion CR (i.e., a distance D_SW1) between the first side walls SW1 may be substantially the same as the width W_120*a* of the slit 120*a*. Accordingly, the distance D_SW1 between the first side walls SW1 may be substantially the same as the width W_110*a* of the groove 110*a*. Therefore, the first side walls SW1 may substantially lie in the same plane as side walls SW_110*a* of the groove 110*a*. That is, the first side walls SW1 of the first active regions 100*b*_1 and the side walls SW_110*a* of the groove 110*a* may be substantially coplanar.

The second active region 100*b*_2 may be recessed such that a top surface of the second active region 100*b*_2 lies between a bottom surface of the groove 110*a* and a top surface of the first active regions 100*b*_1. A step S1 between the bottom surface of the groove 110*a* and the top surface of the recessed second active region 100*b*_2 may determine a channel width of a transistor. A step S2 between the top surface of the second active region 100*b*_2 and the top surface of the first active region 100*b*_1 may determine a channel length of a transistor.

The second active region 100*b*_2 may be recessed using an anisotropic etch method. In one embodiment, the second active region 100b_2 can be recessed by using an etch recipe having an etch selectivity so as to selectively etch the active pattern 100b, that is, an etch recipe which has etch selectivity with respect to the device isolation layer 110 and the etch mask pattern 120.

Figure 1E:
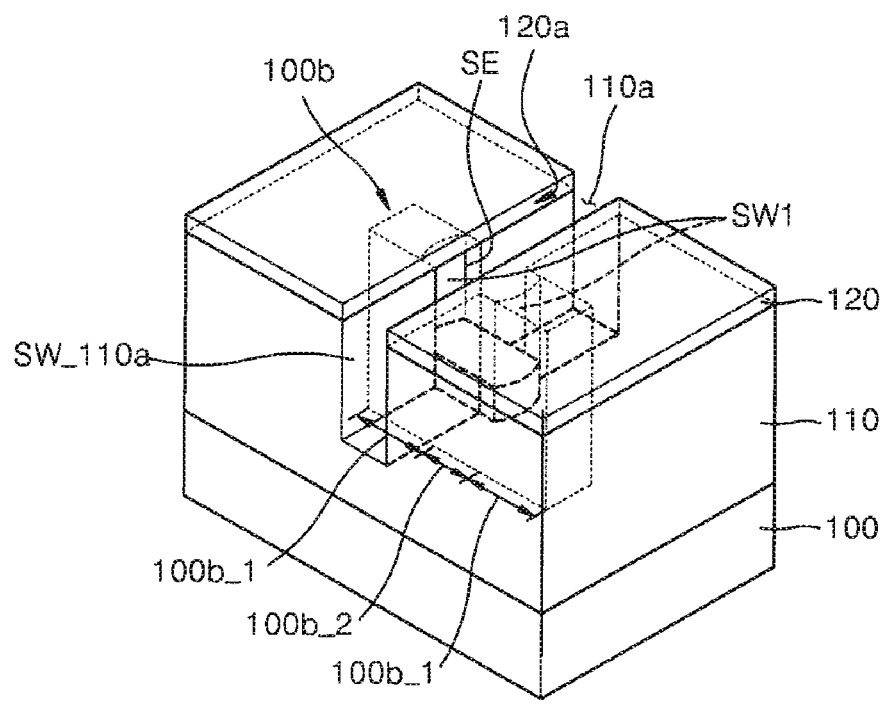
Figure 2E:
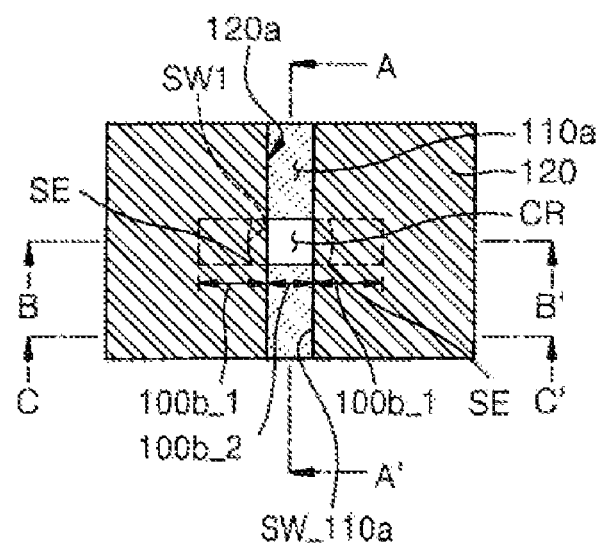
Figure 3E:
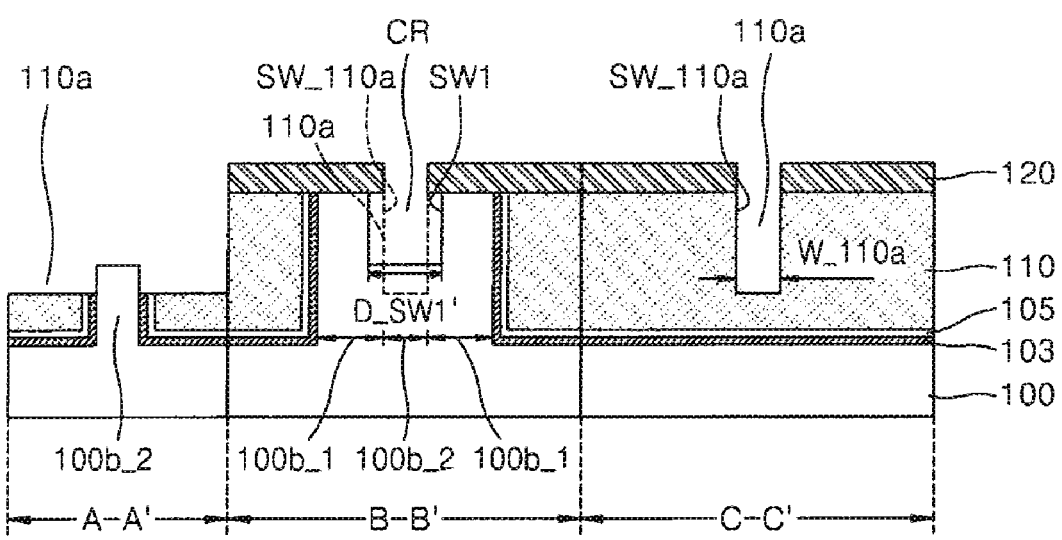

Referring to FIGS. 1E, 2E, and 3E, the first side walls SW1 of the first active regions 100b_1 exposed by the channel recess portion CR are etched using the etch mask pattern 120 as a mask. As a result, the distance D_SW1' between the first side walls SW1 is greater than the width W_110a of the groove 110a, and the side walls SW_110a of the groove 110a protrude out further than the first side walls SW1, respectively. For example, the side walls SW_110a of the groove 110a may protrude out further than central portions of the first side walls SW1 and side edges SE of the first side walls SW1. Therefore, side edges SE of the first side walls SW1 may not be exposed in the groove 110a.

The first side walls SW1 may be recessed such that side edges SE of the first side walls SW1 are not exposed in the groove 110a even when the width W_110a of the groove 110a is increased in a subsequent process.

The first side walls SW1 may be etched using an isotropic etch method. At this time, the distance between the central portions of the facing first side walls SW1 may be greater than the distance between the side edges SE of the facing first side walls SW1. The isotropic etch method can be a wet etch method. The first side walls SW1 of the first active regions 100b_1 can be etched by using an etch recipe which can selectively etch the active pattern 100b, that is, an etch recipe which has etch recipe with respect to the device isolation layer 110 and the etch mask pattern 120.

Figure 1F:
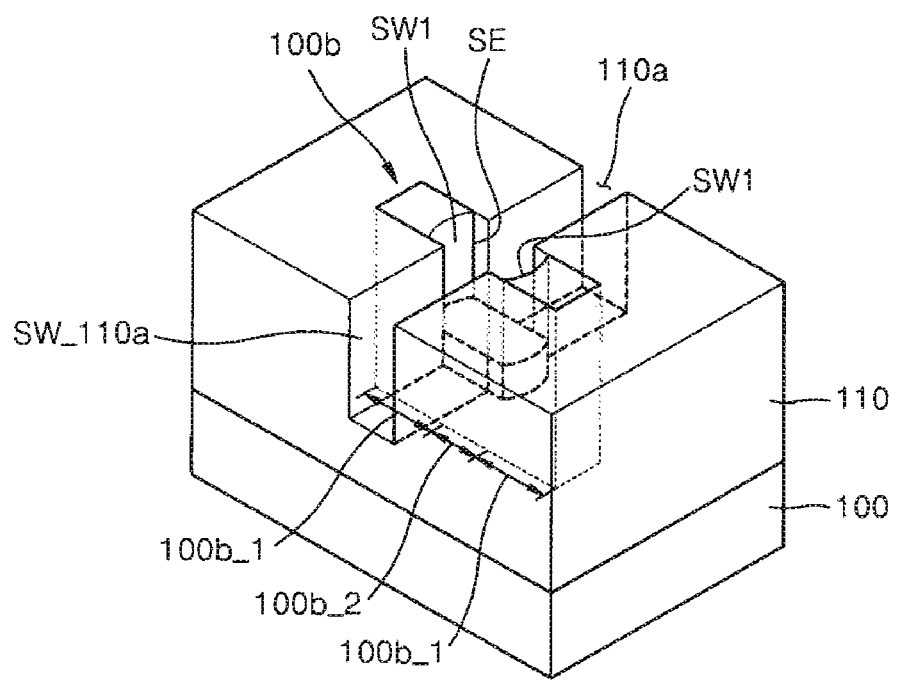
Figure 2F:
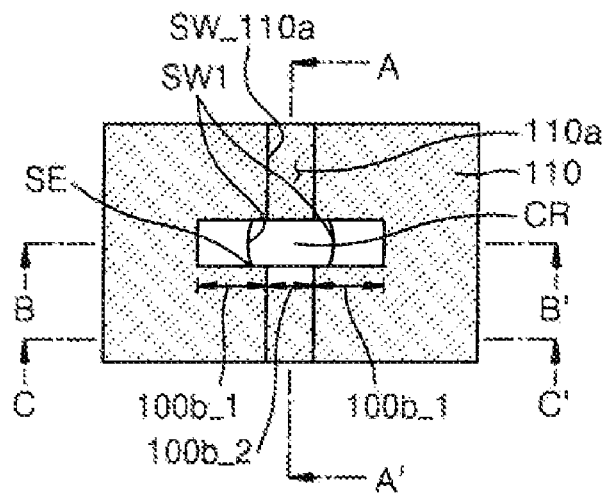
Figure 3F:
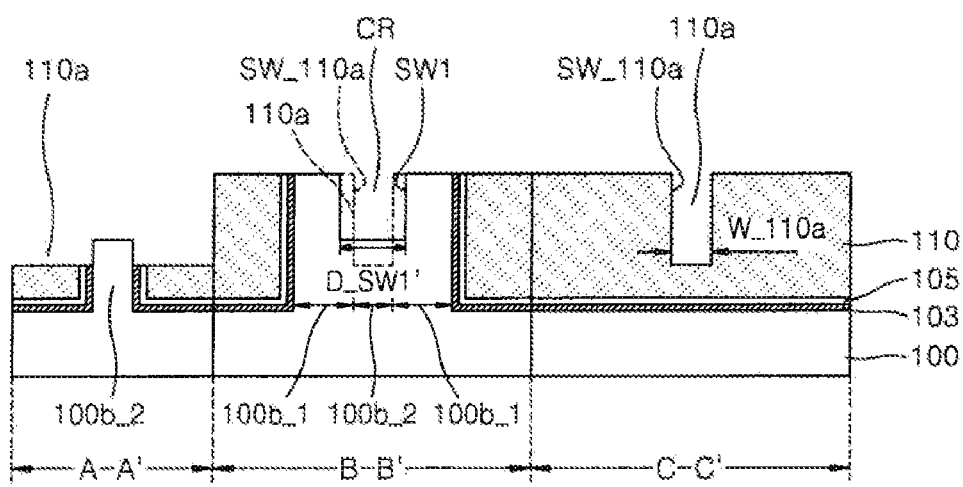

Referring to FIGS. 1F, 2F, and 3F, the etch mask pattern 120 is removed to expose top surfaces of the first active regions 100b_1 and a top surface of the device isolation layer 110. According to other embodiments, the etch mask pattern 120 can be removed before the first side walls SW1 of the first active regions 100b_1 are etched.

Figure 4:
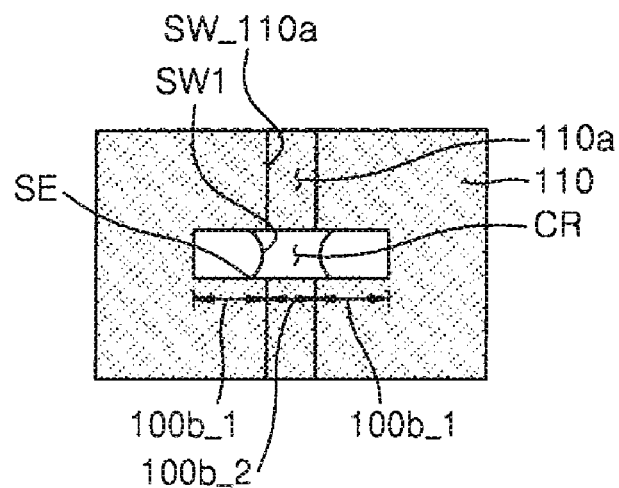
FIG. 4 is a plan view illustrating a method of fabricating a semiconductor device according to another embodiment of the present invention.

According to another embodiment of the present invention, side edges SE of the first side walls SW1 exposed by the channel recess portion CR can be selectively etched using the etch mask pattern 120 as a mask. Therefore, the side edges SE can be recessed with respect to central portions of the first side walls SW1 and thus, central portions of the first side walls SW1 may protrude out further than the side edges SE. As a result, the side edges SE may not be exposed by the groove 110a. At this time, the distance between central portions of the facing first side walls SW1 may be less than the distance between the side edges SE of the facing first side walls SW1 as exemplarily shown in FIG. 4.

Figure 1G:
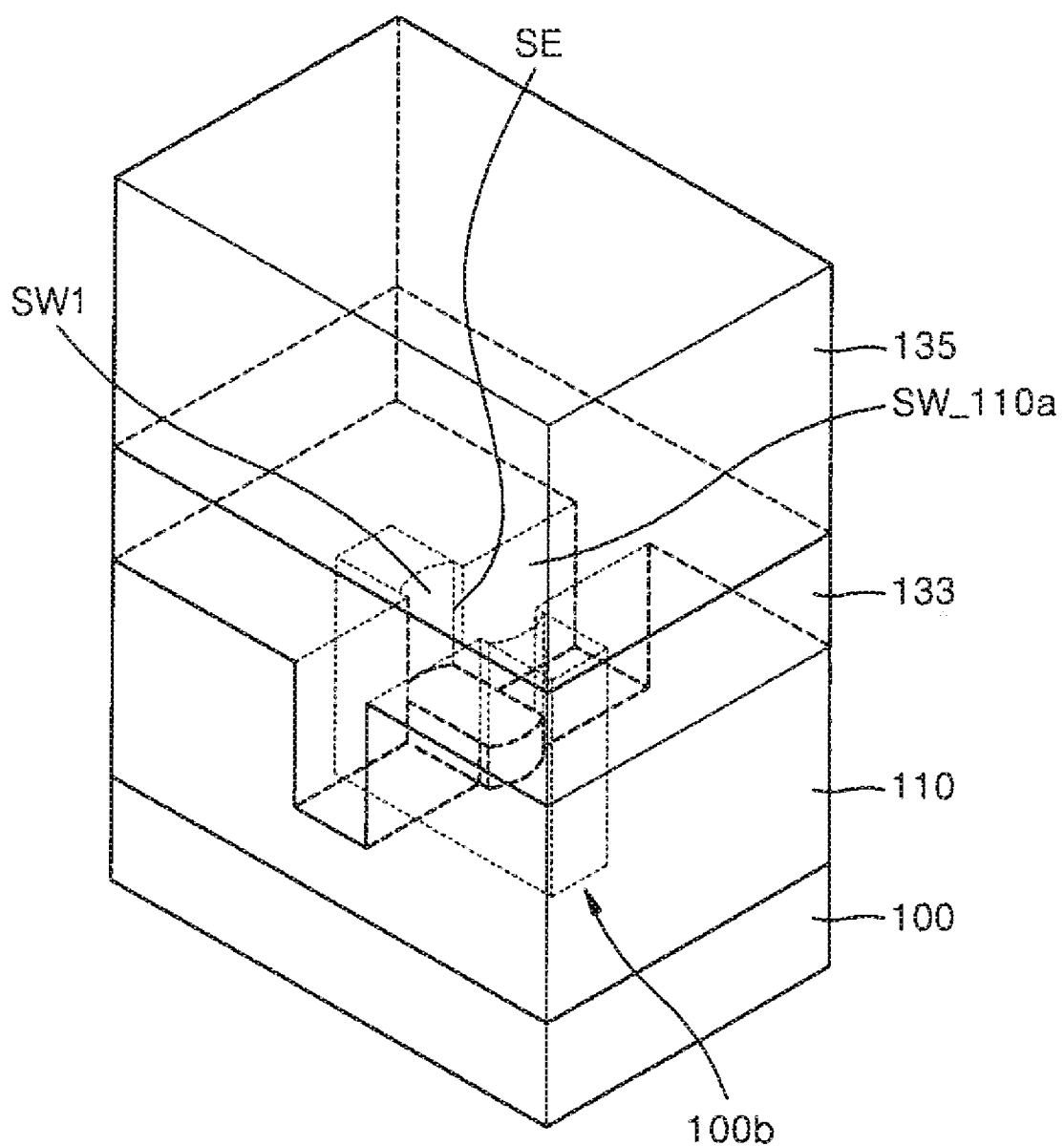
Figure 2G:
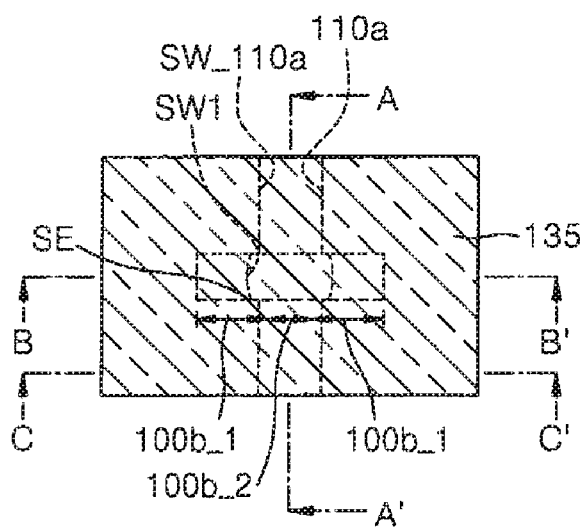
Figure 3G:
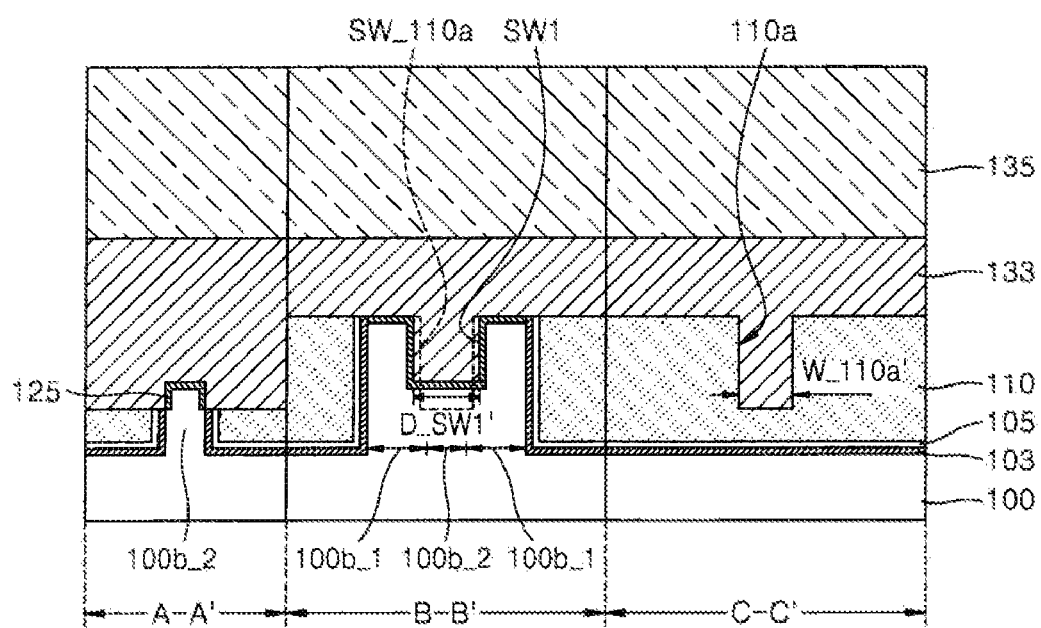

Referring to FIGS. 1G, 2G, and 3G, a cell gate insulating layer 125 is formed on the active pattern 100b. The cell gate insulating layer 125 can be prepared by thermally oxidizing the active pattern 100b. That is, the cell gate insulating layer 125 can be a thermal oxide layer.

In one embodiment, a circuit gate insulating layer (not shown) can be selectively formed in a peripheral circuit region of the semiconductor substrate 100 before the cell gate insulating layer 125 is formed. For example, the circuit gate insulating layer can be formed on the substrate, and then, a portion of the circuit gate insulating layer corresponding to the cell array region can be removed. At this time, a portion of the device isolation layer 110 corresponding to the cell array region can also be etched. Accordingly, the width W_110a of the groove 110a can be increased. Since the first side walls SW1 are sufficiently recessed as described above, side edges SE of the first side walls SW1 may not be exposed in the groove 110a even when the width W_110a is increased.

Therefore, according to a degree of an increase in the width W_110a of the groove 110a, side walls SW_110a of the groove 110a can protrude out further than the side edges SE or can contact the side edges SE.

A gate electrode layer 133 and a capping layer 135 may be sequentially formed on the semiconductor substrate 100 including the cell gate insulating layer 125. The gate electrode layer 133 may be formed to such a thickness that the gate electrode layer 133 substantially fills the groove 110a and the channel recess portion CR. The gate electrode layer 133 can include, for example, a double layer of a polycrystalline silicon and metal silicide. The metal silicide can include, for example, tungsten silicide, cobalt silicide or the like or a combination thereof. The capping layer 135 can include, for example, a silicon nitride layer.

Figure 1H:
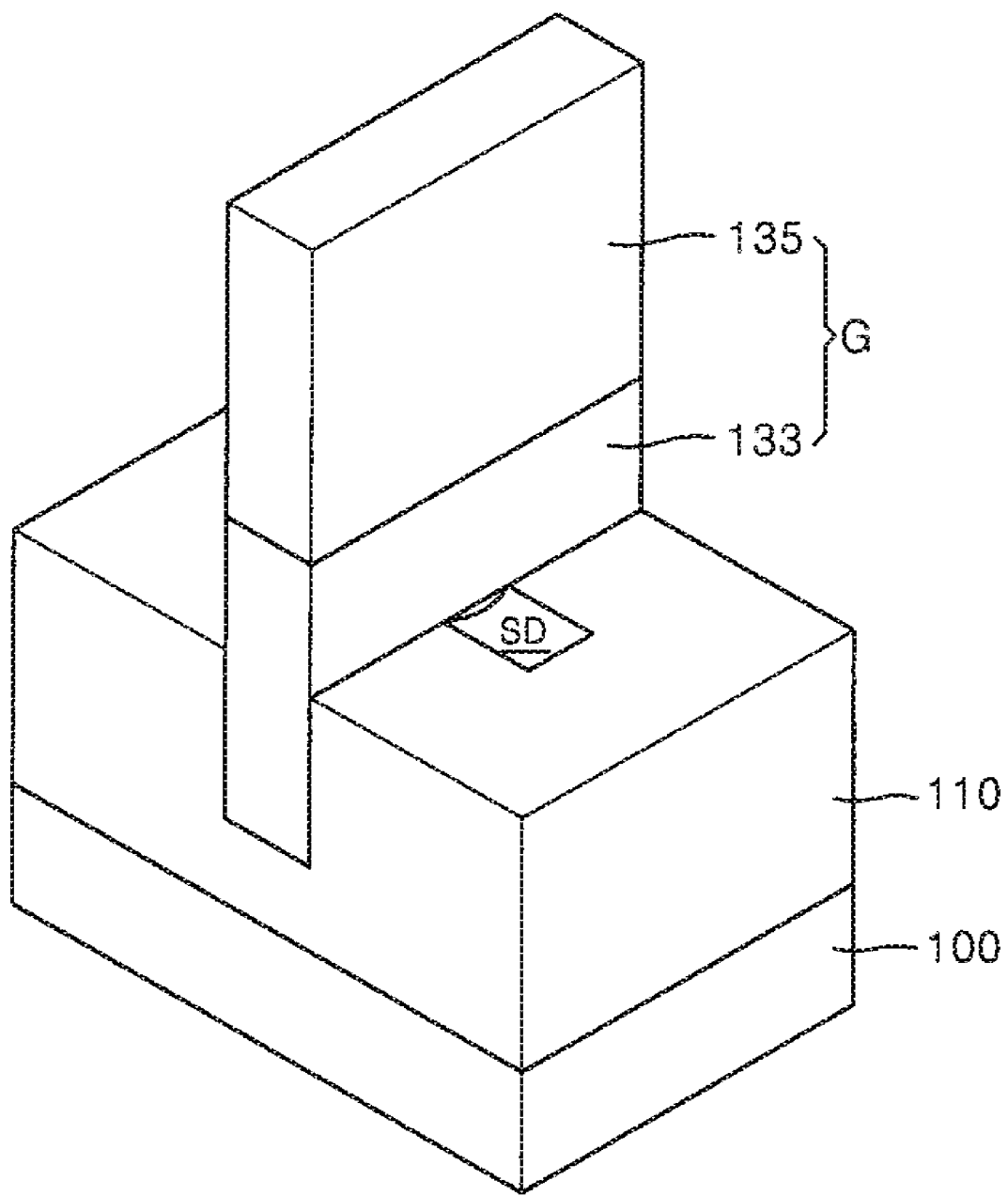
Figure 2H:
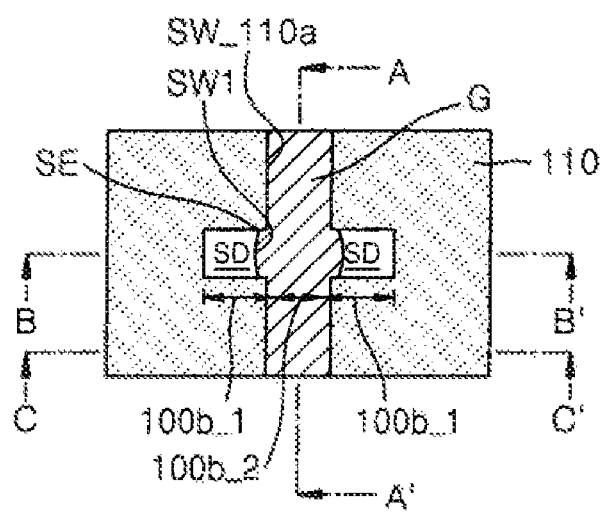
Figure 3H:
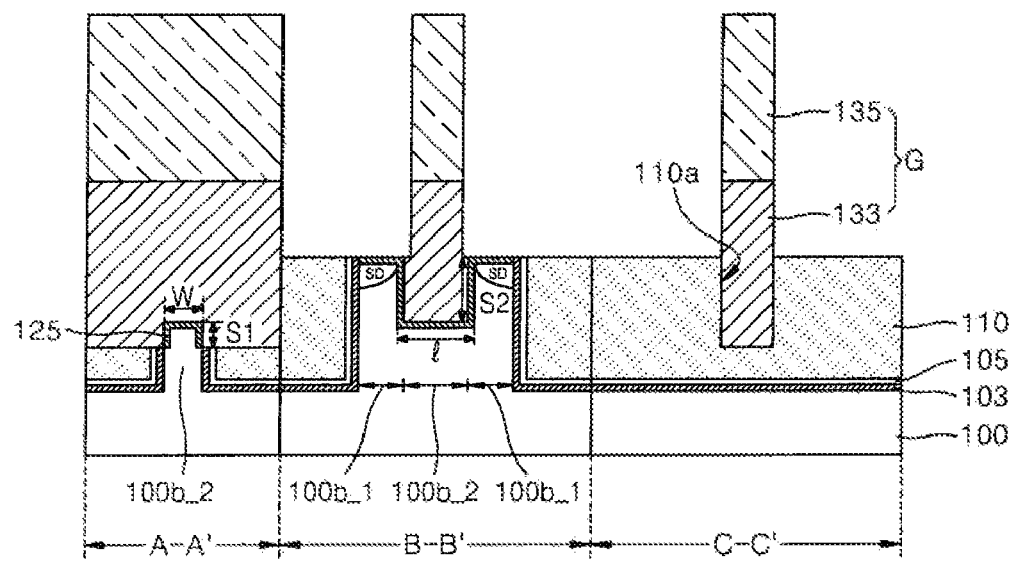

Referring to FIGS. 1H, 2H, and 3H, the capping layer 135 and the gate electrode layer 133 are sequentially patterned to form a gate pattern G which fills the groove 110a and the channel recess portion CR and extends along the groove 110a.

Then, source and drain regions SD are formed in the active pattern 100b by performing an ion implantation method using the gate pattern G as a mask. As a result, a region between the source and drain regions SD is defined as a channel region. At this time, the width of the channel region may be the sum of steps S1 between the bottom surface of the groove 110a and a top surface of the recessed second active region 100b_2 and the width W of the recessed second active region 100b_2. Accordingly, a channel width is increased compared to a conventional flat transistor so that a narrow width effect can be prevented. In addition, a channel length can be the sum of steps S2 between the top surface of the recessed second active region 100b_2 and the top surfaces of the first active region 100b_1 and the length l of the recessed second active region 100b_2. Accordingly, the channel length can be also increased compared to a conventional flat transistor and thus, a short channel effect can be prevented.

Figure 5:
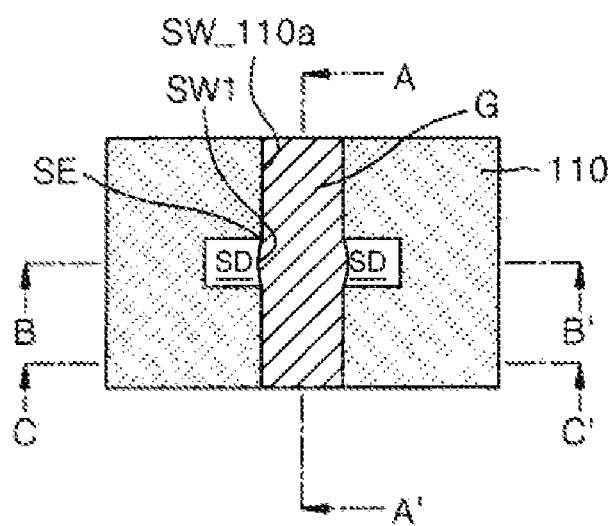
FIG. 5 a plan view illustrating a method of fabricating a semiconductor device according to another embodiment of the present invention.

As exemplarily described above, the side walls SW_110a of the groove 110a can protrude out further than the side edges SE. In another embodiment, the side walls SW_110a of the groove 110a can contact the side edges SE so that the side edges SE of the first side walls SW1 are not exposed in the groove 110a. FIG. 5 is a sectional view of a semiconductor device in which the side walls SW_110a of the groove 110a contact the side edges SE. Accordingly, the gate pattern G formed in the groove 100a may not surround the side edges SE of the first side walls SW1. That is, the gate pattern G may not surround the source and drain regions SD formed in the first active region 100b_1. Accordingly, a decrease of a threshold voltage of a transistor can be prevented, and a leakage current between the source/drain region SD and the gate pattern G, that is, a gate induced drain leakage (GIDL) can be prevented.

Figure 1I:
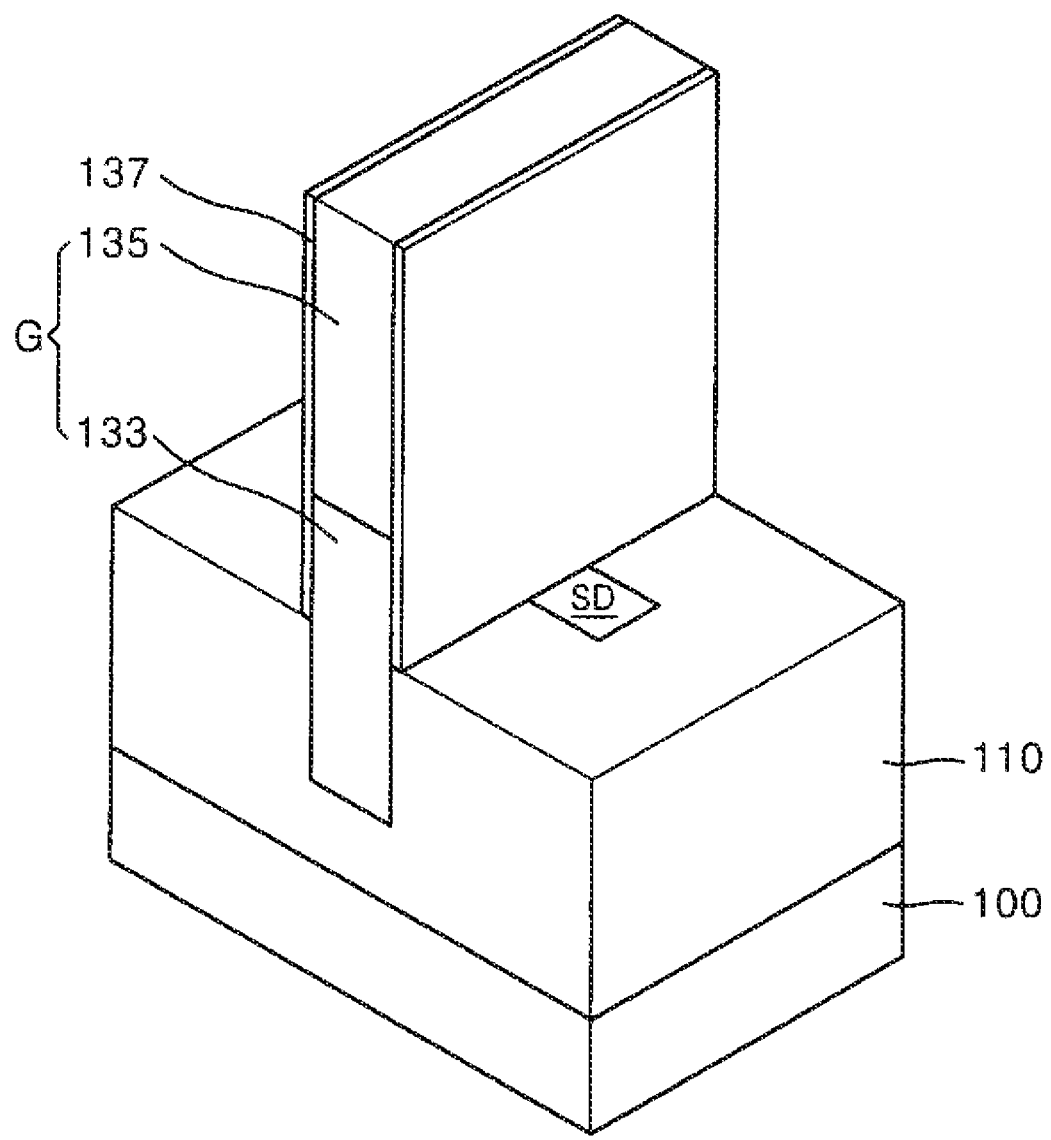
Figure 2I:
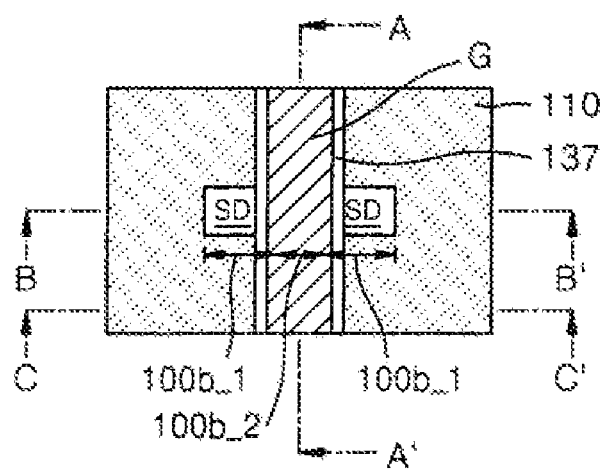
Figure 3I:
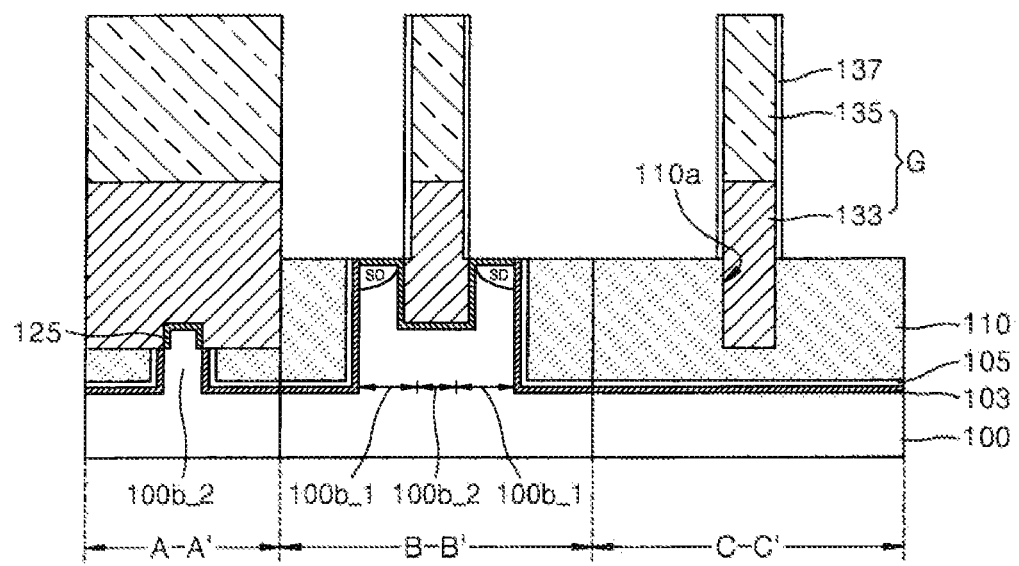

Referring to FIGS. 1I, 2I, and 3I, a gate spacer insulating layer is formed on the gate pattern G, and then, the gate spacer insulating layer is anisotropically etched to form a gate spacer 137 on side walls of the gate pattern G.

Figure 6A:
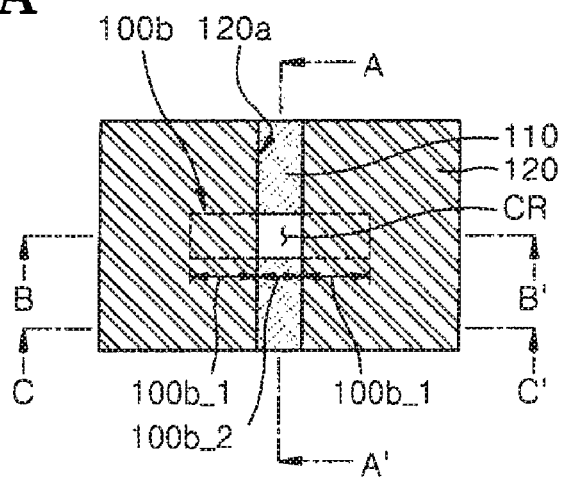
FIGS. 6A through 6C are plan views sequentially illustrating a method of fabricating a semiconductor device according to another embodiment of the present invention.
Figure 6B:
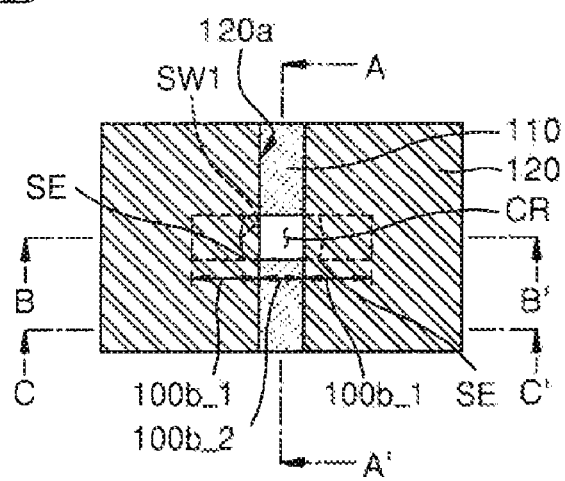
Figure 6C:
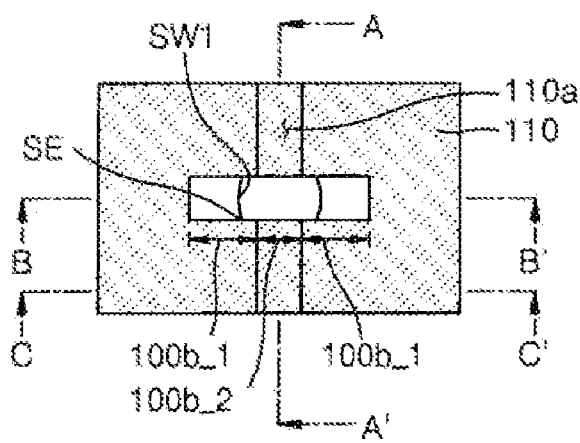
Figure 7A:
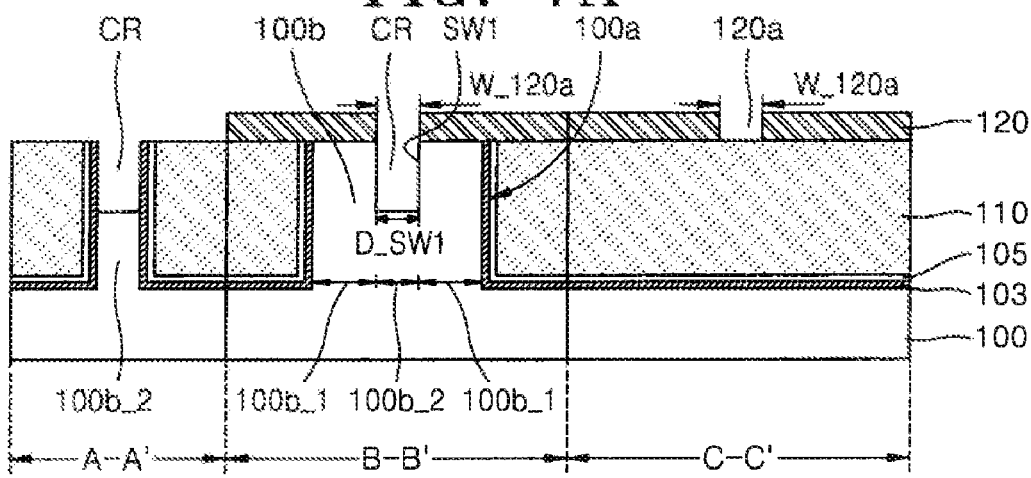
FIGS. 7A through 7C are sectional views taken along lines A-A', B-B', and C-C' of FIGS. 6A through 6C.
Figure 7B:
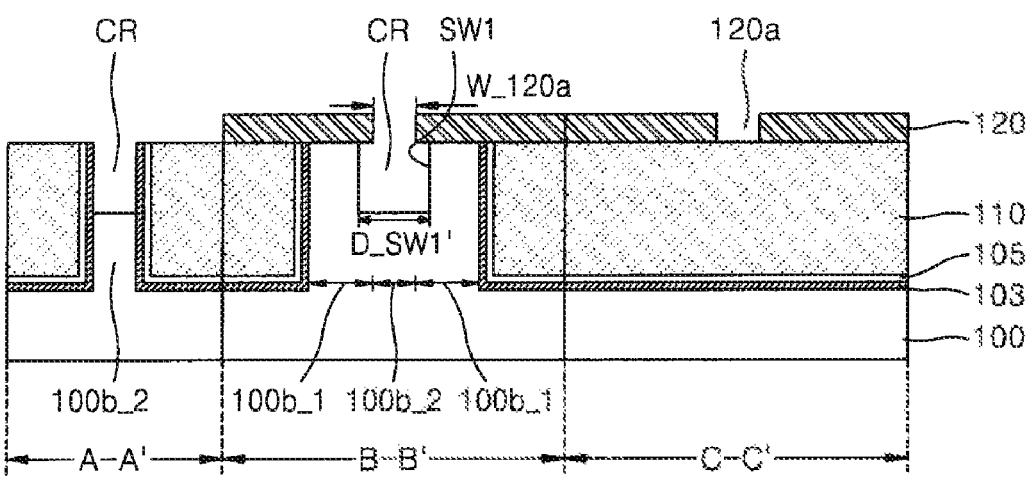
Figure 7C:
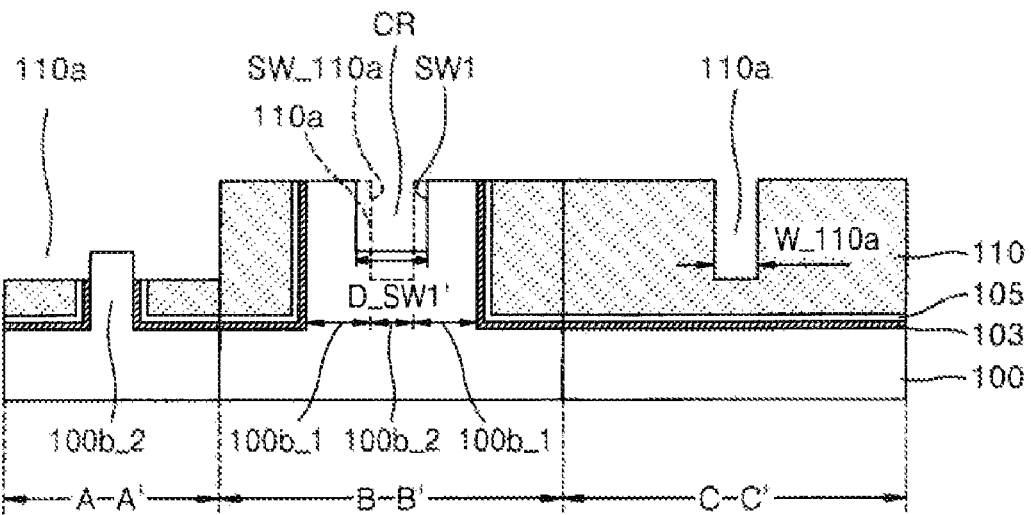

FIGS. 6A through 6C are plan views sequentially illustrating a method of fabricating a semiconductor device according to another embodiment of the present invention. FIGS. 7A through 7C are sectional views taken along lines A-A', B-B', and C-C' of FIGS. 6A through 6C. The method according to the current embodiment is the same as the method described with reference to FIGS. 1A through 1I, 2A through 2I, and 3A through 3I except for the processes described hereinafter.

Referring to FIGS. 6A and 7A, a device isolation trench 100a is formed in a semiconductor substrate 100 to define an active pattern 100b. The active pattern 100b protrudes over the semiconductor substrate 100. The active pattern 100b includes first active regions 100b_1 and a second active region 100b_2 interposed between the first active regions 100b_1.

A first insulating liner 103 and a second insulating liner 105 can be formed on an inner wall of the device isolation trench 100a.

A device isolation insulating layer filling the device isolation trench 100a is formed on the semiconductor substrate 100 including the first and second insulating liners 103 and 105. Then, the device isolation insulating layer is evenly etched until a top surface of the active pattern 100b is exposed, thereby forming a device isolation layer 110 surrounding the active pattern 100b.

An etch mask pattern 120 having a slit 120a extending so as to cross over the second active region 100b_2 is formed on the active pattern 100b and the device isolation layer 110. The slit 120a may have a width W_120a. In one embodiment, the width W_120a is substantially uniform. Accordingly, a portion of the slit 120a exposing the second active region 100b_2 and a portion of the slit 120a exposing the device isolation layer 110 can have the same width W_120a.

A top portion of the second active region 100b_2 exposed by the slit 120a is etched using the etch mask pattern 120 as a mask so that the second active region 100b_2 is recessed to form a channel recess portion CR between the first active regions 100b_1. Side walls of the first active regions 100b_1 exposed by the channel recess portion CR, that is, first side walls SW1 are exposed to face each other. A distance D_SW1 between the first side walls SW1 may be the same as the width W_120a of the slit 120a. In one embodiment, the distance D_SW1 between the first side walls SW1 may be the same as the width W_120a of the slit 120a.

Referring to FIGS. 6B and 7B, the first side walls SW1 exposed by the channel recess portion CR are etched using the etch mask pattern 120 as a mask. As a result, the first side walls SW1 are recessed with respect to side walls of the etch mask pattern 120. For example, the distance D_SW1' between the facing first side walls SW1 may be greater than the width W_120a of the slit 120a.

The first side walls SW1 can be etched using an isotropic etch method. In the illustrated embodiment, a distance between central portions of the facing first side walls SW1 may be greater than a distance between side edges SE of the facing first side walls SW1. In one embodiment, the isotropic etch method can, for example, include a wet etch method.

Referring to FIGS. 6C and 7C, a top portion of the device isolation layer 110 exposed by the slit 120a is etched to form a groove 110a using the etch mask pattern 120 as a mask, and then the etch mask pattern 120 is removed. As a result, upper side walls of the recessed second active region 100b_2 are exposed by the groove 110a. When the groove 110a is formed, the first and second insulating liners 103 and 105 having relatively small thicknesses can be removed so that upper side walls of the recessed second active region 100b_2 can be exposed.

The width W_110a of the groove 110a can be substantially the same as the width W_120a of the slit 120a. Accordingly, the width W_110a of the groove 110a can be smaller than the distance D_SW1' between the first side walls SW1. Moreover, side walls SW_110a of the groove 110a can protrude out further than the first side walls SW1. For example, the side walls SW_110a of the groove 110a can respectively protrude out further than the central portions of the first side walls SW1 and the side edges SE of the first side walls SW1. Accordingly, the side edges SE of the first side walls SW1 may not be exposed in the groove 110a.

Proceeding from the structure exemplarily described above with respect to FIGS. 6C and 7C, a semiconductor device may be fabricated using the method described with reference to FIGS. 1G through 1I, 2G through 2I, and 3G through 3I.

FIGS. 8A through 8D are plan views sequentially illustrating a method of fabricating a semiconductor device according to another embodiment of the present invention. FIGS. 9A through 9D are sectional views taken along lines A-A', B-B', and C-C' of FIGS. 8A through 8D. The method according to the current embodiment is the same as the method described with reference to FIGS. 1A through 1I, 2A through 2I, and 3A through 3I, except for the processes described hereinafter.

Figure 8A:
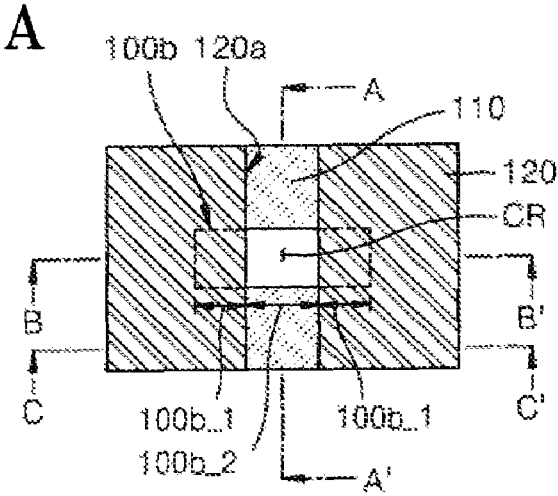
FIGS. 8A through 8D are plan views sequentially illustrating a method of fabricating a semiconductor device according to another embodiment of the present invention.
Figure 9A:
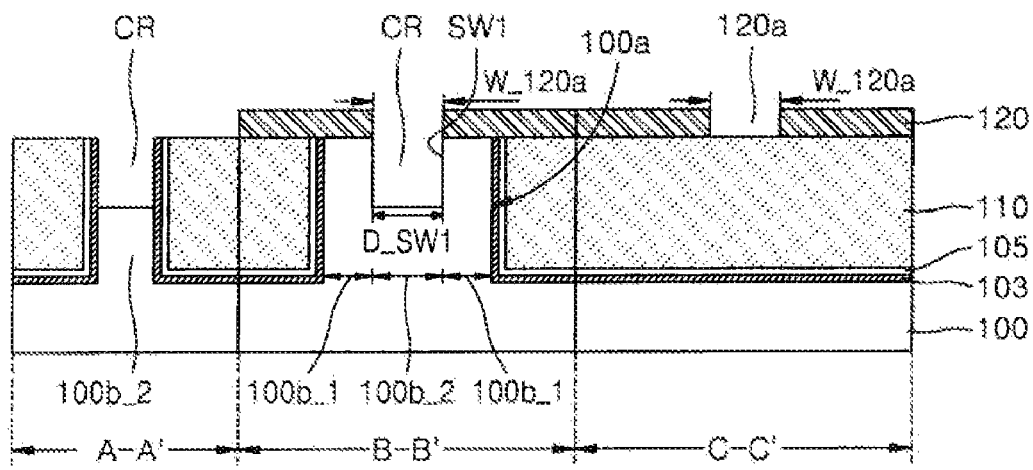
FIGS. 9A through 9D are sectional views taken along lines A-A', B-B', and C-C' of FIGS. 8A through 8D.

Referring to FIGS. 8A and 9A, a device isolation trench 100a is formed in a semiconductor substrate 100 to define an active pattern 100b. The active pattern 100b protrudes from the semiconductor substrate 100. The active pattern 100b includes first active regions 100b_1 and a second active region 100b_2 interposed between the first active regions 100b_1.

A first insulating liner 103 and a second insulating liner 105 can be formed on an inner wall of the device isolation trench 100a. A device isolation insulating layer filling the device isolation trench 100a may be formed on the semiconductor substrate 100 including the first and second insulating liners 103 and 105. Then, the device isolation insulating layer may be evenly etched until a top surface of the active pattern 100b is exposed, thereby forming a device isolation layer 110 surrounding the active pattern 100b.

An etch mask pattern 120 having a slit 120a extending so as to cross over the second active region 100b_2 is formed on the active pattern 100b and the device isolation layer 110. In one embodiment, the slit 120a can have a substantially uniform width W_120a. For example, a portion of the slit 120a exposing the second active region 100b_2 and a portion of the slit 120a exposing the device isolation layer 110 can have the same width W_120a.

A top portion of the second active region 100b_2 exposed by the slit 120a is etched using the etch mask pattern 120 as a mask so that the second active region 100b_2 is recessed to form a channel recess portion CR between the first active regions 100b_. Side walls of the first active regions 100b_1 (i.e., first side walls SW1) are exposed by the channel recess portion CR and thus face each other. A distance D_SW1 between the first side walls SW1 may be the same as the width W_120a of the slit 120a. The top portion of the second active region 100b_2 can, for example, be anisotropically etched.

Figure 8B:
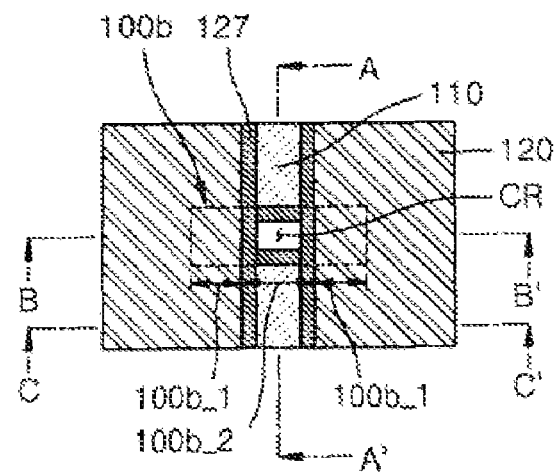
Figure 9B:
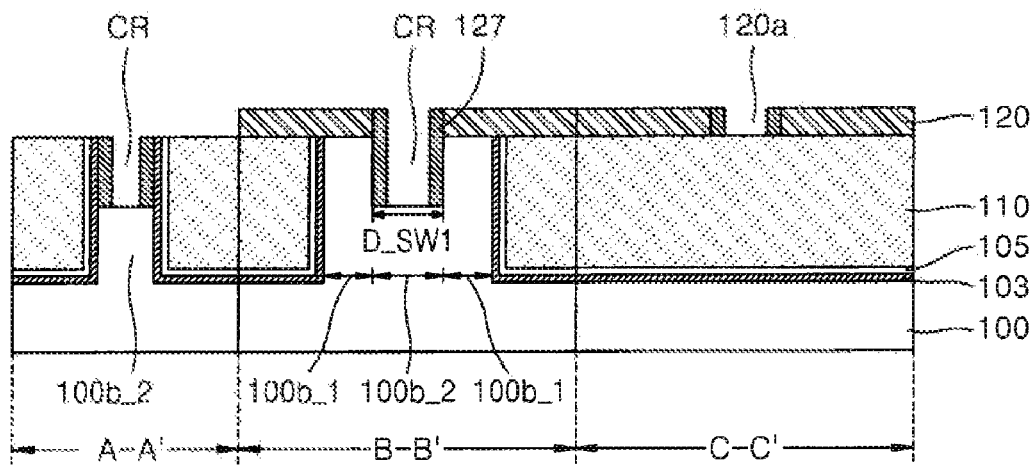

Referring to FIGS. 8B and 9B, a sacrificial spacer insulating layer is formed on the substrate 100 including the etch mask pattern 120, and then anisotropically etched to form a sacrificial spacer 127 on side walls of the etch mask pattern 120 and side walls of the channel recess portion CR. The sacrificial spacer 127 can, for example, include a material having an etch selectivity with respect to the active pattern 110b and the device isolation layer 110. For example, the sacrificial spacer 127 can include a silicon nitride layer.

Figure 8C:
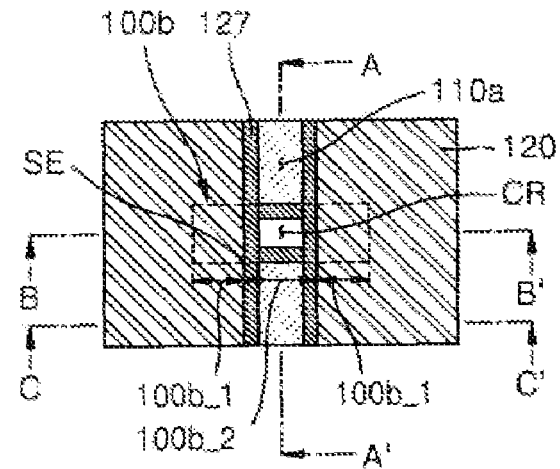
Figure 9C:
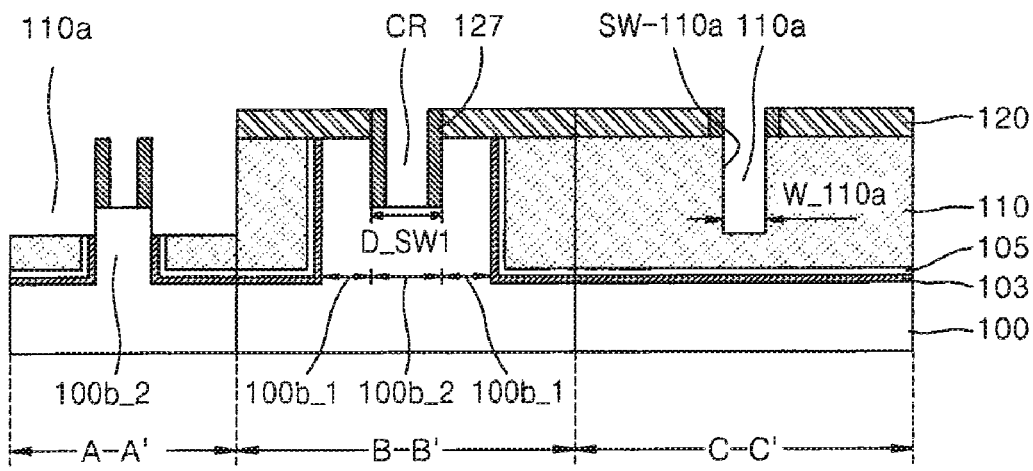

Referring to FIGS. 8C and 9C, a top portion of the device isolation layer 110 exposed by the slit 120a is etched using the etch mask pattern 120 and the sacrificial spacer 127 as a mask to form a groove 110a. The groove 110a exposes upper side walls of the second active region 100b_2 recessed. When the groove 110a is formed, the first and second insulating liners 103 and 105 having relatively small thicknesses may be removed to expose the upper side walls of the second active region 100b_2. The top portion of the device isolation layer 110 can, for example, be anisotropically etched.

A width W_110a of the groove 110a can be smaller than a width W_120a of the slit 120a of the etch mask pattern 120 due to the sacrificial spacer 127. Accordingly, the width W_110a of the groove 110a can be smaller than a distance D_SW1 between the facing first side walls SW1.

Figure 8D:
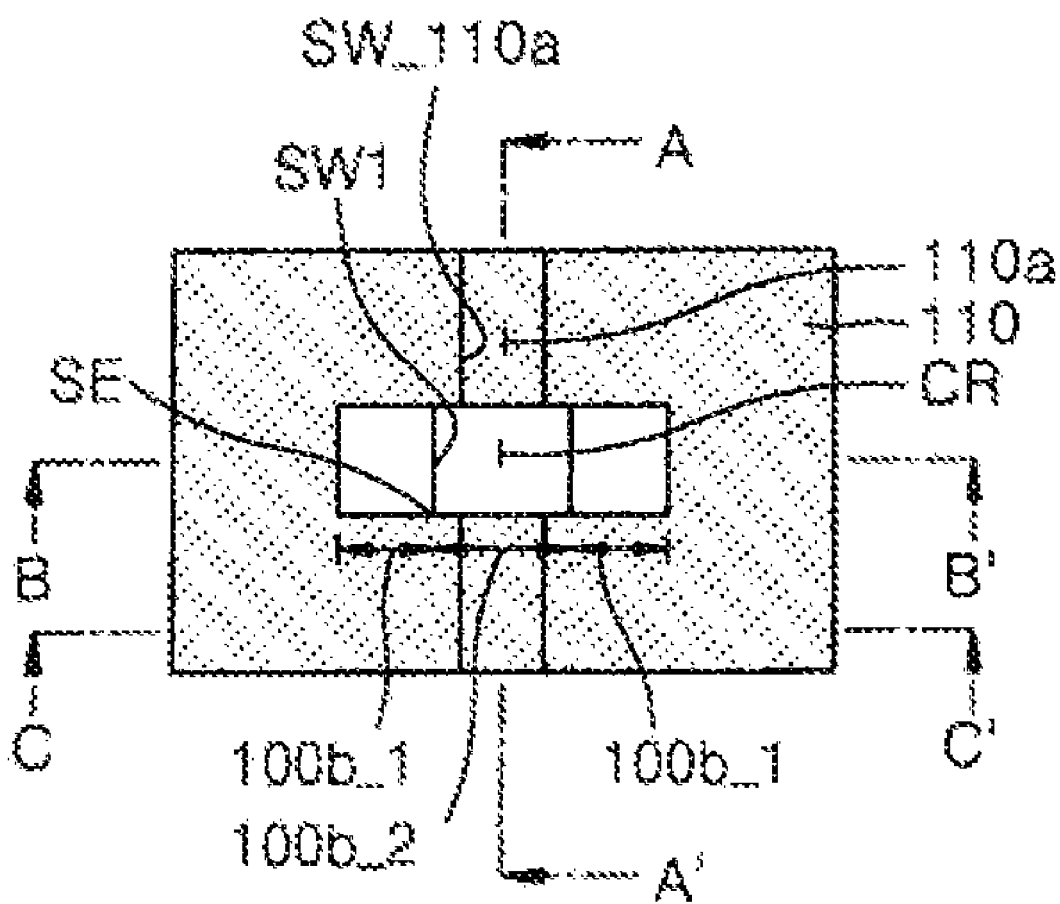
Figure 9D:
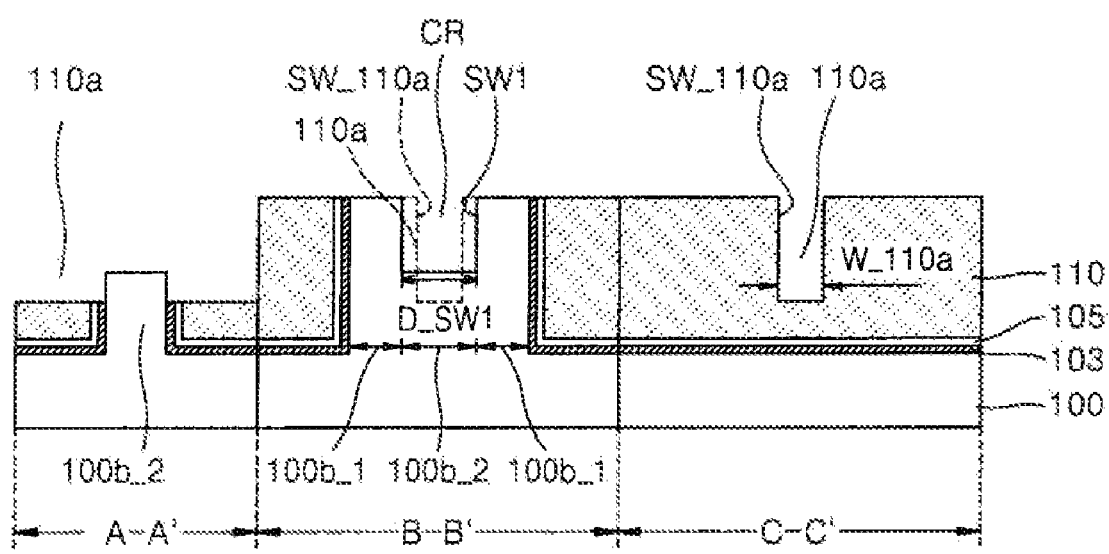

Referring to FIGS. 8D and 9D, the sacrificial spacer 127 and the etch mask pattern 120 are removed.

As described above, the width W_110a of the groove 110a is smaller than the distance D_SW1 between the first side walls SW1. As a result, side walls SW_110a of the groove 110a can protrude out further than the first side walls SW1. For example, the side walls SW_110a of the groove 110a can respectively protrude out further than central portions of the first side walls SW1 and side edges SE of the first side walls SW1. Accordingly, the side edges SE of the first side walls SW1 may not be exposed in the groove 110a.

Proceeding from the structure exemplarily described above with respect to FIGS. 8D and 9D, a semiconductor device may be fabricated using the method described with reference to FIGS. 1G through 1I, 2G through 2I, and 3G through 3I.

FIGS. 10A through 10D are plan views sequentially illustrating a method of fabricating a semiconductor device according to another embodiment of the present invention. FIGS. 11A through 11D are sectional views taken along lines A-A', B-B', and C-C' of FIGS. 10A through 10D. The method according to the current embodiment is the same as the method described with reference to FIGS. 1A through 1I, 2A through 2I, and 3A through 3I except for the processes described hereinafter.

Figure 10A:
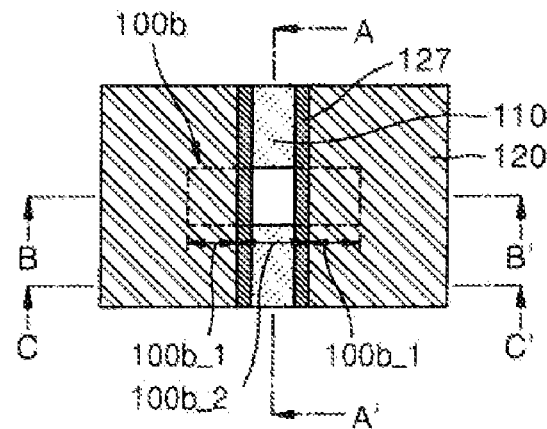
FIGS. 10A through 10D are plan views sequentially illustrating a method of fabricating a semiconductor device according to another embodiment of the present invention.
Figure 11A:
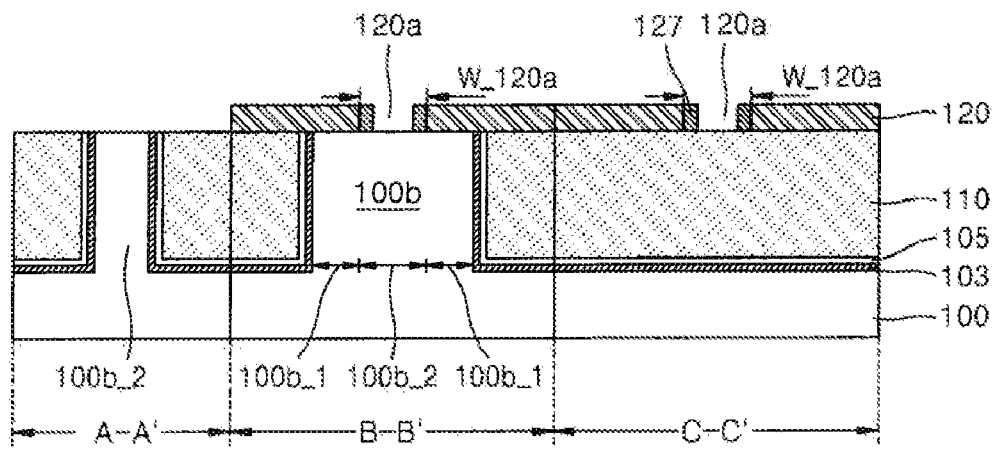
FIGS. 11A through 11D are sectional views taken along lines A-A', B-B', and C-C' of FIGS. 10A through 10D.

Referring to FIGS. 10A and 11A, a device isolation trench 100a is formed in a semiconductor substrate 100 to define an active pattern 100b. The active pattern 100b protrudes from the semiconductor substrate 100. The active pattern 100b includes first active regions 100b_1 and a second active region 100b_2 interposed between the first active regions 100b_1.

A first insulating liner 103 and a second insulating liner 105 can be formed on an inner wall of the device isolation trench 100a. A device isolation insulating layer filling the device isolation trench 100a may be formed on the semiconductor substrate 100 including the first and second insulating liners 103 and 105. Then, the device isolation insulating layer may be evenly etched until a top surface of the active pattern 100b is exposed, thereby forming a device isolation layer 110 surrounding the active pattern 100b.

An etch mask pattern 120 having a slit 120a extending so as to cross over the second active region 100b_2 is formed on the active pattern 100b and the device isolation layer 110. The slit 120a can have a substantially uniform width W_120a. Specifically, a portion of the slit 120a exposing the second active region 100b_2 and a portion of the slit 120a exposing the device isolation layer 110 can have the same width W_120a.

A sacrificial spacer insulating layer is formed on the substrate 100 including the etch mask pattern 120, and then anisotropically etched to form a sacrificial spacer 127 on side walls of the etch mask pattern 120 and side walls of the channel recess portion CR. The sacrificial spacer 127 can, for example, include a material having an etch selectivity with respect to the active pattern 110b and the device isolation layer 110. For example, the sacrificial spacer 127 can include a silicon nitride layer.

Figure 10B:
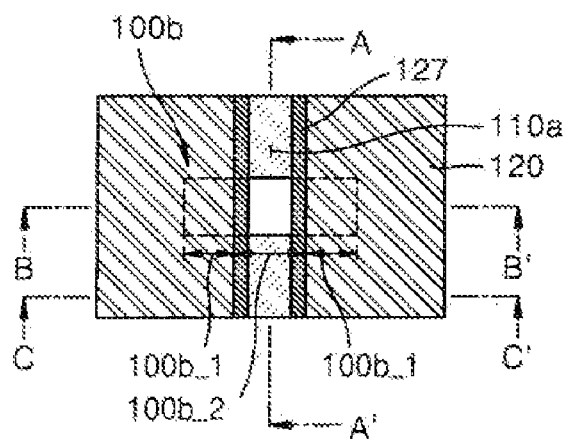
Figure 11B:
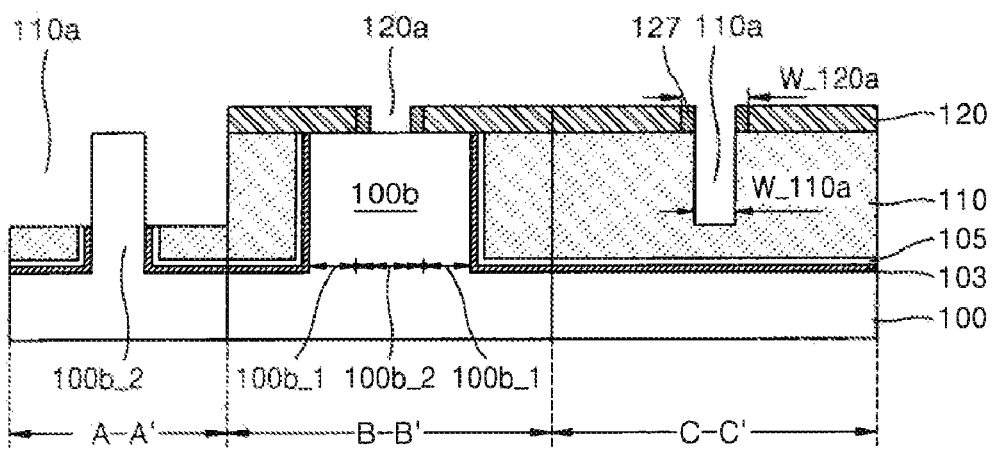

Referring to FIGS. 10B and 11B, a top portion of the device isolation layer 110 exposed by the slit 120a is etched using the etch mask pattern 120 and the sacrificial spacer 127 as a mask to form a groove 110a. The groove 110a exposes upper side walls of the second active region 100b_2. When the groove 110a is formed, the first and second insulating liners 103 and 105 having relatively small thicknesses are removed to expose upper side walls of the second active region 100b_2. The top portion of the device isolation layer 110 can, for example, be anisotropically etched.

A width W_110a of the groove 110a can be smaller than a width W_120a of the slit 120a of the etch mask pattern 120 due to the sacrificial spacer 127.

Figure 10C:
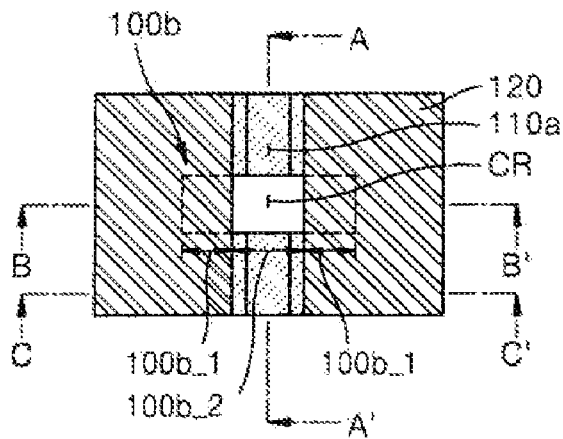
Figure 11C:
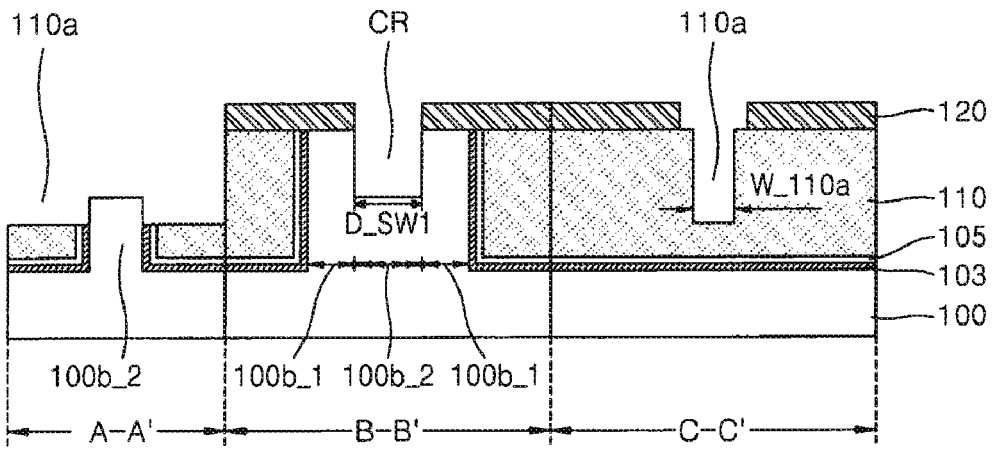

Referring to FIGS. 10C and 11C, the sacrificial spacer 127 is removed to expose side walls of the etch mask pattern 120 and the device isolation layer 110 under the sacrificial spacer 127.

A top portion of the second active region 100b_2 exposed by the slit 120a is then etched using the etch mask pattern 120 having exposed side walls as a mask so that the second active region 100b_2 is recessed and a channel recess portion CR is formed between the first active regions 100b_1. The second active region 100b_2 is recessed such that a top surface of the recessed second active region 100b_2 is located between a bottom surface of the groove 110a and the top surface of the first active region 100b_1. The top portion of the second active region 100b_2 may be anisotropically etched.

Side walls of the first active regions 100b_1 (i.e., first side walls SW1) are exposed by the channel recess portion CR and face each other. A distance D_SW1 between the facing first side walls SW1 may be the same as a width W_120a of the slit 120a. Meanwhile, as described above, the width W_110a of the groove 110a is smaller than the width W_120a of the slit 120a due to the sacrificial spacer 127. As a result, the width W_110a of the groove 110a can be smaller than a distance D_SW1 between the facing first side walls SW1.

Figure 10D:
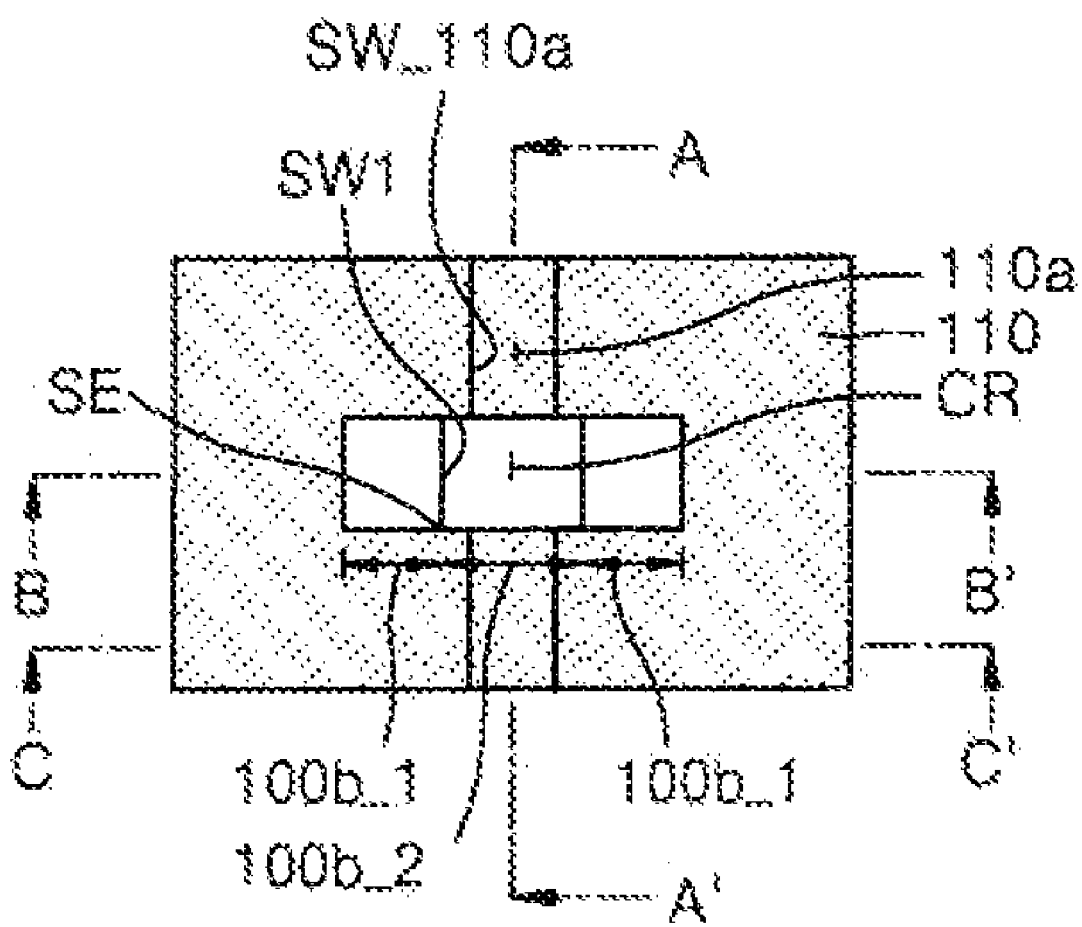
Figure 11D:
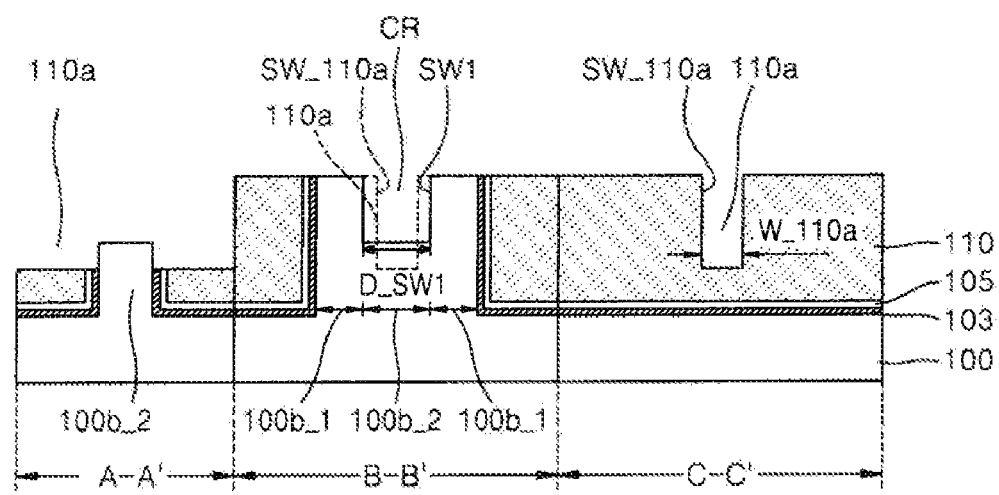

Referring to FIGS. 10D and 11D, the etch mask pattern 120 are removed.

As described above, the width W_110a of the groove 110a is smaller than the distance D_SW1 between the facing first side walls SW1, and thus, side walls SW_110a of the groove 110a can protrude out further than the facing first side walls SW1. Specifically, side walls SW_110a of the groove 110a may respectively protrude out further than central portions of the first side walls SW1 and side edges SE of the first side walls. Accordingly, the side edges SE may not be exposed in the groove 110a.

Proceeding from the structure exemplarily described above with respect to FIGS. 10D and 11D, a semiconductor device is fabricated using the method described with reference to FIGS. 1G through 1I, 2G through 2I, and 3G through 3I.

Figure 12:
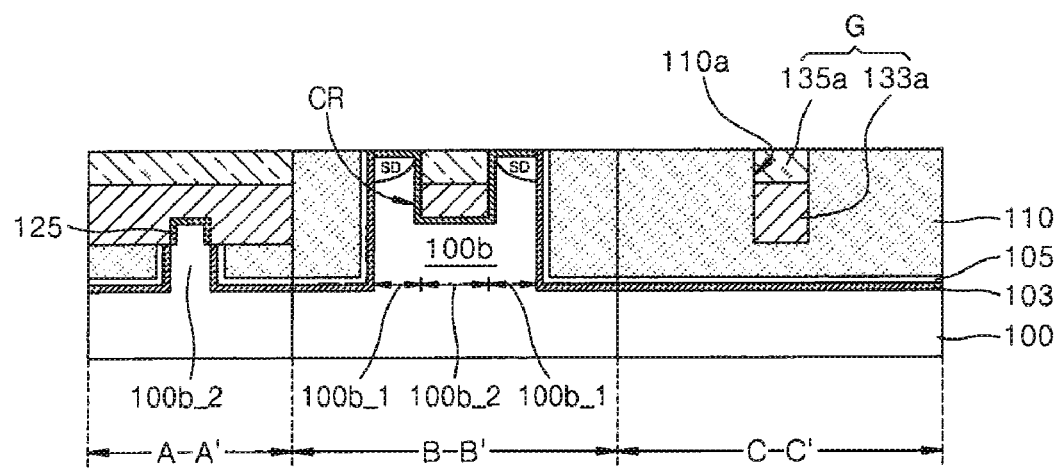
FIG. 12 is a sectional view of a semiconductor device according to another embodiment of the present invention.

FIG. 12 is a sectional view of a semiconductor device according to another embodiment of the present invention.

First, a semiconductor device may be fabricated using the method described with reference to FIGS. 1A through 1F, FIGS. 2A through 2F, and FIGS. 3A through 3F.

Next, with reference to FIG. 12, a cell gate insulating layer 125 is formed on an active pattern 100b and a gate electrode layer is formed on the semiconductor substrate 100 including the cell gate insulating layer 125. The gate electrode layer is formed to such a thickness that the groove 110a and the channel recess portion CR are substantially filled. Then, the gate electrode layer is evenly etched back to form a gate electrode 133a in lower regions of the groove 110a and the channel recess portion CR.

A capping insulating layer is formed on the semiconductor substrate 100 including the gate electrode 133a. The capping insulating layer is then evenly etched to form a capping layer 135a in upper regions of the groove 110a and the channel recess portion CR. The gate electrode 133a and the capping layer 135a form a gate pattern G.

FIGS. 13A through 13E are plan views sequentially illustrating a method of fabricating a semiconductor device according to another embodiment of the present invention. FIGS. 14A through 14E are sectional views taken along lines A-A', B-B', and C-C' of FIGS. 13A through 13E. The method according to the current embodiment is the same as the method described with reference to FIGS. 1A through 1I, 2A through 2I, and 3A through 3I, except for the processes described hereinafter.

Figure 13A:
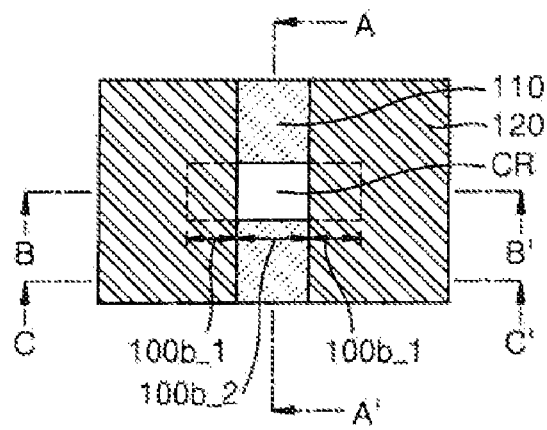
FIGS. 13A through 13E are plan views sequentially illustrating a method of fabricating a semiconductor device according to another embodiment of the present invention.
Figure 14A:
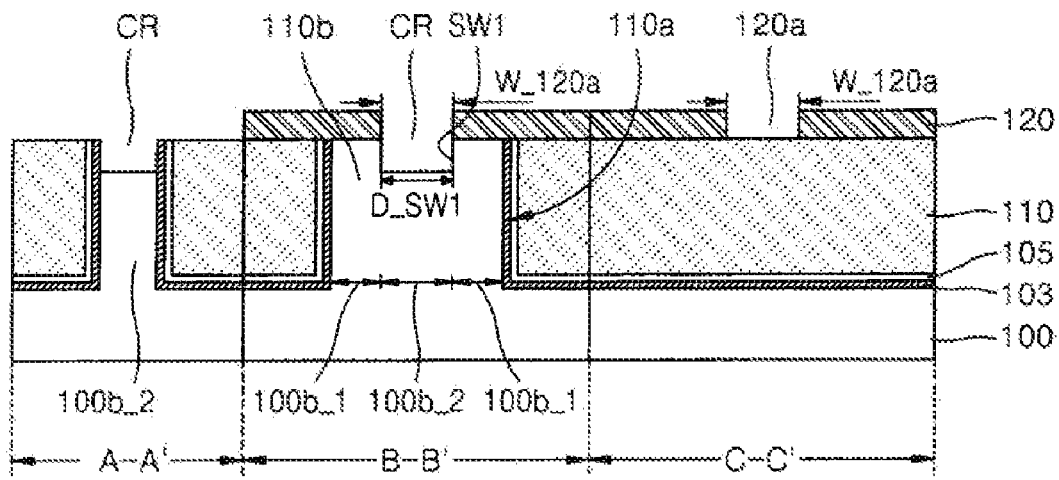
FIGS. 14A through 14E are sectional views taken along lines A-A', B-B', and C-C' of FIGS. 13A through 13E.

Referring to FIGS. 13A and 14A, a device isolation trench 100a is formed in a semiconductor substrate 100 to define an active pattern 100b. The active pattern 100b protrudes from the semiconductor substrate 100. The active pattern 100b includes first active regions 100b_1 and a second active region 100b_2 interposed between the first active regions 100b_1.

A first insulating liner 103 and a second insulating liner 105 can be formed on an inner wall of the device isolation trench 100a. A device isolation insulating layer filling the device isolation trench 100a may be formed on the semiconductor substrate 100 including the first and second insulating liners 103 and 105. Then, the device isolation insulating layer may be evenly etched until a top surface of the active pattern 100b is exposed, thereby forming a device isolation layer 110 surrounding the active pattern 100b.

An etch mask pattern 120 having a slit 120a extending so as to cross over the second active region 100b_2 is formed on the active pattern 100b and the device isolation layer 110. In one embodiment, the slit 120a can have a substantially uniform width W_120a. For example, a portion of the slit 120a exposing the second active region 100b_2 and a portion of the slit 120a exposing the device isolation layer 110 can have the same width W_120a.

A top portion of the second active region 100b_2 exposed by the slit 120a is etched using the etch mask pattern 120 as a mask so that the second active region 100b_2 is recessed to form a channel recess portion CR between the first active regions 100b_1. Side walls of the first active regions 100b_1 (i.e., first side walls SW1) are exposed by the channel recess portion CR and thus face each other. A distance D_SW1 between the facing first side walls SW1 may be the same as the width W_120a of the slit 120a. The top portion of the second active region 100b_2 can, for example, be anisotropically etched.

Figure 13B:
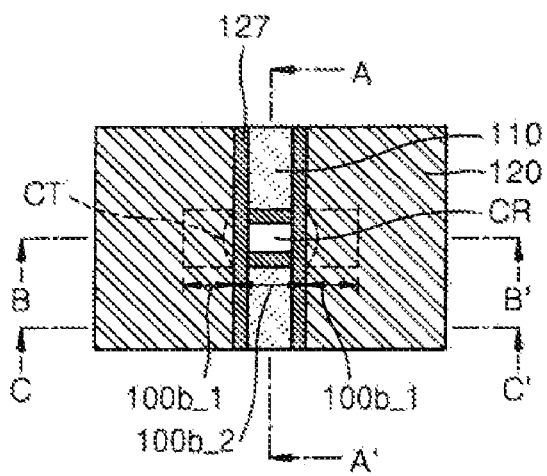
Figure 14B:
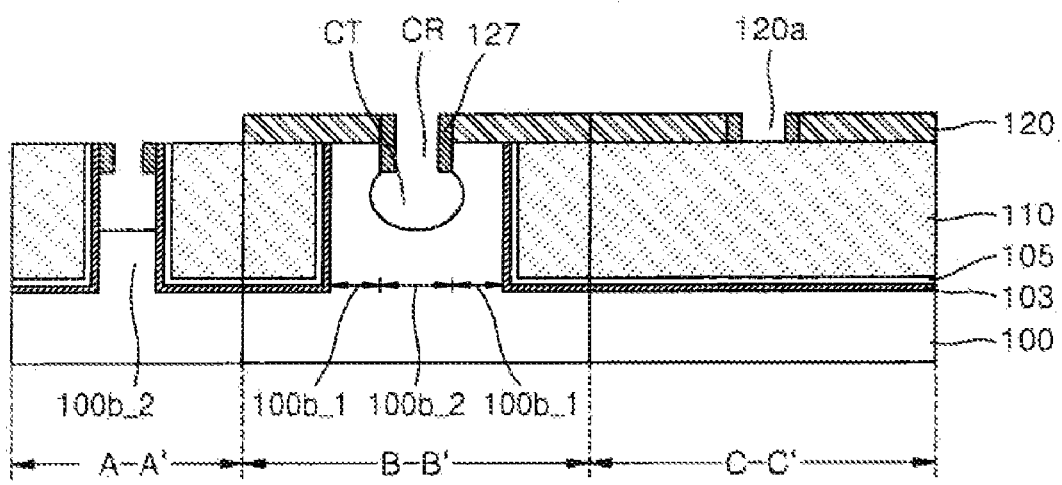

Referring to FIGS. 13B and 14B, a sacrificial spacer insulating layer is formed on the substrate 100 including the etch mask pattern 120, and is then anisotropically etched to form a sacrificial spacer 127 on side walls of the etch mask pattern 120 and side walls of the channel recess portion CR. The sacrificial spacer 127 can include a material having an etch selectivity with respect to the active pattern 110b and the device isolation layer 110. For example, the sacrificial spacer 127 can include a silicon nitride layer.

A top portion of the recessed second active region 100b_2 exposed in the channel recess portion CR is isotropically etched using the etch mask pattern 120 and the sacrificial spacer 127 as a mask. As a result, the second active region 100b_2 is recessed more and a channel trench portion CT extending from the channel recess portion CR is formed under the channel trench portion CT. In one embodiment, the channel trench portion CT may have a semi-spherical shape under the sacrificial spacer 127.

Figure 13C:
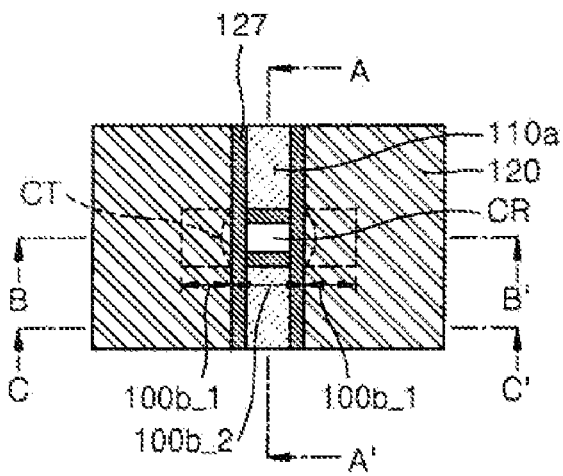
Figure 14C:
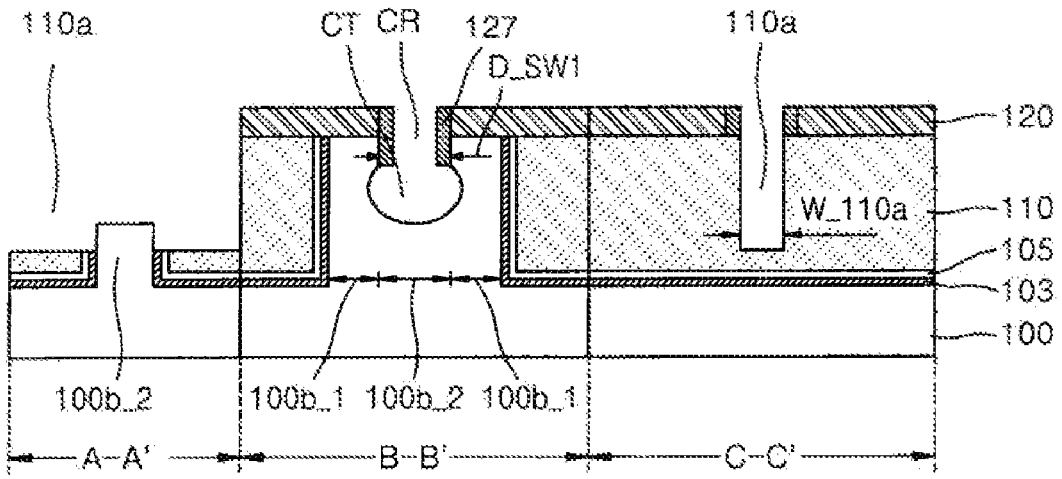

Referring to FIGS. 13C and 14C, a top portion of the device isolation layer 110 exposed by the slit 120a is etched using the etch mask pattern 120 and the sacrificial spacer 127 as a mask to form a groove 110a. The groove 110a exposes upper side walls of the recessed second active region 100b_2. When the groove 110a is formed, the first and second insulating liners 103 and 105 having relatively small thicknesses are removed to expose upper side walls of the recessed second active region 100b_2. The top portion of the device isolation layer 110 can be anisotropically etched.

A width W_110a of the groove 110a may be smaller than a width W_120a of the slit 120a of the etch mask pattern 120 due to the sacrificial spacer 127. Accordingly, the width W_110a of the groove 110a can be smaller than a distance D_SW1 between the facing first side walls SW1.

Figure 13D:
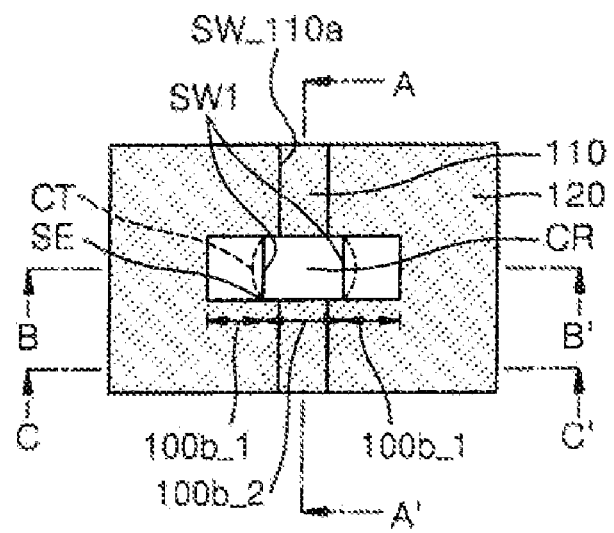
Figure 14D:
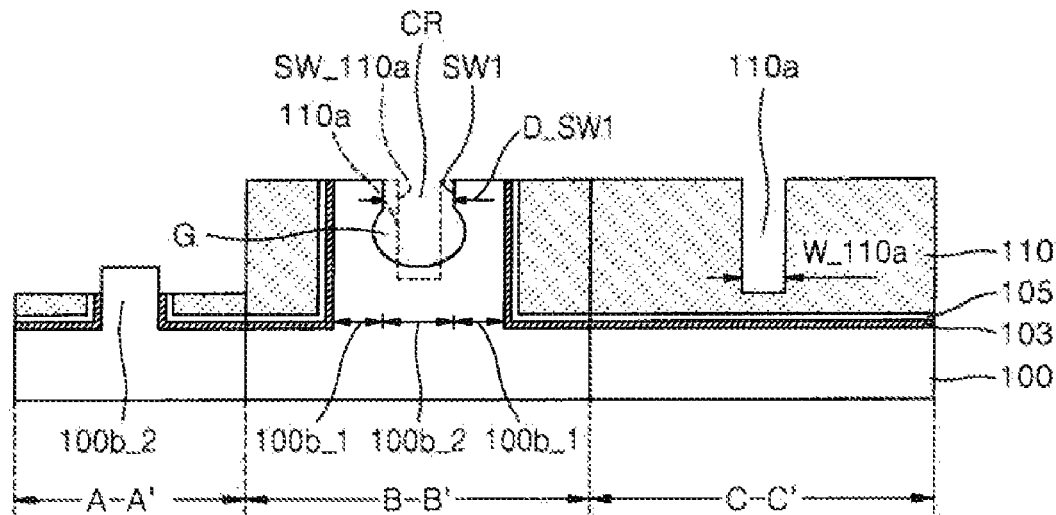

Referring to FIGS. 13D and 14D, the sacrificial spacer 127 and the etch mask pattern 120 are removed.

As described above, since the width W_110a of the groove 110a can be smaller than the distance D_SW1 between the facing first side walls SW1, side walls SW_110a of the groove 110a can respectively protrude out further than the first side walls SW1. For example, the side walls SW_110a of the groove 110a may respectively protrude out further than central portions of the first side walls SW1 and side edges SE of the first side walls SW1. Accordingly, the side edges SE may not be exposed in the groove 110a.

Figure 13E:
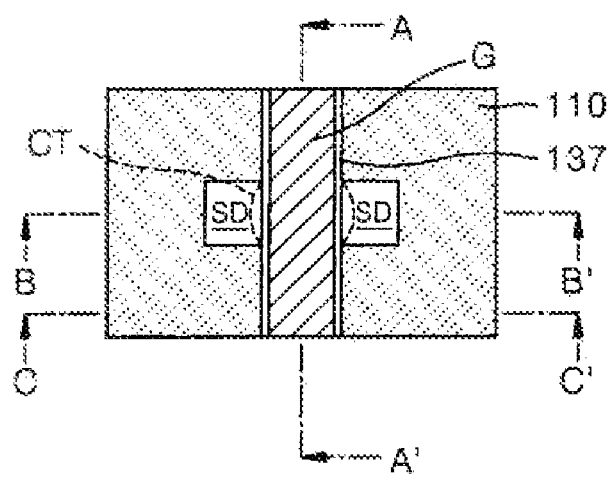
Figure 14E:
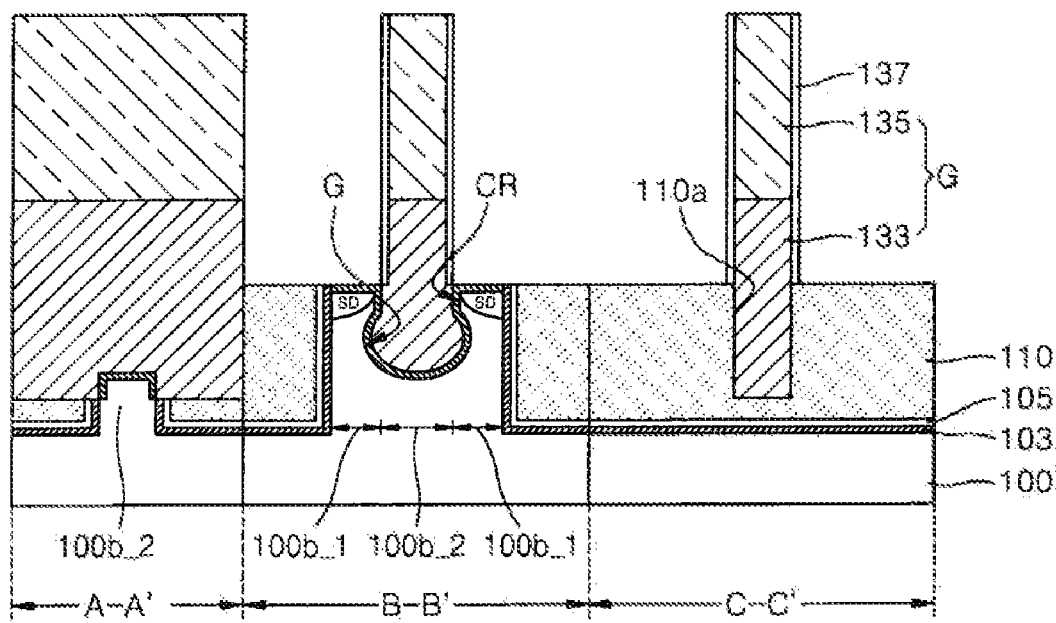

Referring to FIGS. 13E and 14E, a cell gate insulating layer 125 is formed on the active pattern 100b. A gate electrode layer 133 and a capping layer 135 are sequentially formed on the semiconductor substrate 100 including the cell gate insulating layer 125. The gate electrode layer 133 may be formed to such a thickness that the groove 110a, the channel trench portion CT, and the channel recess portion CR are substantially filled. The capping layer 135 and the gate electrode layer 133 are sequentially patterned to form a gate pattern G filling the groove 110a, the channel trench portion CT, and the channel recess portion CR, and extending along the groove 110a.

Source and drain regions SD are formed in the active pattern 100b using ion implanting method using the gate pattern G as a mask. A gate spacer insulating layer is formed on the gate pattern G, and then isotropically etched to form a gate spacer 137 on side walls of the gate pattern G.

As described above, according to the embodiments exemplarily described above, an active pattern including first active regions and a second active region interposed between the first active regions protrudes from a semiconductor substrate. The active pattern also includes a channel recess portion formed by recessing the second active region. A device isolation layer including a groove exposing side walls of the recessed second active region is formed and a gate pattern is disposed in a channel recess portion and the groove. As a result, the gate pattern can cover a top surface and side walls of the second active region. The sum of a height between a bottom surface of the groove and the top surface of the recessed second active region, and a width of the recessed second active region can be a channel width. Accordingly, a channel width achieved according to the embodiments exemplarily described above can be greater than a channel width of a conventional flat transistor so that a narrow width effect can be prevented. A channel length may be the sum of a height between the top surface of the recessed second active region and top surfaces of the first active regions, and a length of the recessed second active region. Accordingly, a channel length achieved according to the embodiments exemplarily described above may be greater than a channel length of a conventional flat transistor, so that a short channel effect can be prevented.

Moreover, a distance between side walls of the groove is less than a distance between opposing side walls of the first active regions exposed by the channel recess portion, so that side edges of the first side walls in the groove are not exposed.

Accordingly, the gate pattern formed in the groove may not surround the side edges. Therefore, the gate pattern may not surround source and drain regions in the first active region. As a result, a decrease in a threshold voltage of a transistor can be prevented and a leakage current between the source/drain regions and the gate pattern, that is, GIDL can be prevented.

Embodiments of the present invention can be practiced in many ways, what follows below is a non-limiting discussion of example embodiments that may be practiced according to the description presented above.

One example embodiment can be generally characterized as a method of fabricating a semiconductor device according to a method that includes forming an active pattern comprising first active regions and a second active region interposed between the first active regions, the active pattern protruding above a surface of a semiconductor substrate; forming a device isolation layer surrounding the active pattern; recessing a top portion of the second active region to form a channel recess portion exposing opposing side walls of the first active regions; and forming a groove in the device isolation layer exposing side walls of the second active region, wherein a distance between opposing side walls of the first active regions is greater than a distance between side walls of the groove.

The aforementioned method may further include, before forming the groove and the channel recess portion, forming an etch mask pattern on the active pattern and the device isolation layer, the etch mask pattern comprising a slit crossing over the second active region, wherein the groove is formed by etching the device isolation layer using the etch mask pattern as a mask, and the channel recess portion is formed by etching the top portion of the second active region using the etch mask pattern as a mask.

According to the aforementioned method, the slit may have a substantially uniform width.

The aforementioned method may further include etching opposing side walls of the first active regions so that the distance between opposing side walls of the first active regions is greater than the distance between side walls of the groove.

According to the aforementioned method, the opposing side walls of the first active regions may be isotropically etched.

According to the aforementioned method, the channel recess portion may be formed after forming the groove. The method may further include, after forming the channel recess portion, etching opposing side walls of the first active regions exposed by the channel recess portion so that the distance between opposing side walls of the first active regions is greater than the distance between side walls of the groove.

According to the aforementioned method, the groove may be formed after the channel recess portion is formed and after the opposing side walls of the first active regions exposed by the channel recess portion are etched.

The aforementioned method may further include, before forming the groove and the channel recess portion, forming an etch mask pattern on the active pattern and the device isolation layer, the etch mask pattern comprising a slit crossing over the second active region; and forming a sacrificial spacer on side walls of the etch mask pattern, wherein the groove may be formed by etching the device isolation layer using the etch mask pattern and the sacrificial spacer as a mask, and the channel recess portion may be formed by recessing the top portion of the second active region using the etch mask pattern as a mask.

According to the aforementioned method, the sacrificial spacer may be formed on the side walls of the etch mask pattern and the side walls of the channel recess portion after the channel recess portion is formed.

The aforementioned method may further include, before or after forming the groove, recessing the top portion of the recessed second active region using the etch mask pattern and the sacrificial spacer as a mask to form a channel trench portion extending from the channel recess portion.

According to the aforementioned method, recessing the top portion of the recessed second active region may include isotropically etching the recessed second active region to form the channel trench portion.

The aforementioned method may further include, after forming the groove, removing the sacrificial spacer to expose the side walls of the etch mask pattern, wherein the channel recess portion is formed using the etch mask pattern having exposed side walls as a mask.

The aforementioned method may further include forming a gate pattern filling the groove and the channel recess portion.

According to the aforementioned method, a top surface of the gate pattern may protrude above a top surface of at least one of at least one of the active pattern and the device isolation layer.

According to the aforementioned method, a top surface of the gate pattern may be substantially coplanar with a top surface of at least one of the active pattern and the device isolation layer.

Another example embodiment can be generally characterized as a method of fabricating a semiconductor device according to a method that includes forming an active pattern comprising first active regions and a second active region interposed between the first active regions, the active pattern protruding above a surface of a semiconductor substrate; forming a device isolation layer surrounding the active pattern; forming an etch mask pattern on the active pattern and the device isolation layer, the etch mask pattern comprising a slit crossing the second active region; etching the device isolation layer using the etch mask pattern as a mask to form a groove exposing side walls of the second active region in the device isolation layer; recessing a top portion of the second active region using the etch mask pattern as a mask to form a channel recess portion exposing opposing side walls of the first active regions, wherein a top surface of the recessed second active region protrudes above a bottom surface of the groove; and etching the opposing side walls of the first active regions exposed by the channel recess portion.

According to the aforementioned method, the slit may have a substantially uniform width.

According to the aforementioned method, the opposing side walls of the first active regions may be isotropically etched.

Yet another example embodiment can be generally characterized as a method of fabricating a semiconductor device according to a method that includes forming an active pattern comprising first active regions and a second active region interposed between the first active regions, the active pattern protruding above a surface of a semiconductor substrate; forming a device isolation layer surrounding the active pattern; forming an etch mask pattern on the active pattern and the device isolation layer, the etch mask pattern comprising a slit crossing the second active region; recessing a top portion of the second active region using the etch mask pattern as a mask to form a channel recess portion exposing opposing side walls of the first active regions; etching the opposing side walls of the first active regions exposed by the channel recess portion; and etching the device isolation layer using the etch mask pattern as a mask to form a groove exposing side walls of the second active region in the device isolation layer.

According to the aforementioned method, the slit may have a substantially uniform width.

According to the aforementioned method, the opposing side walls of the first active regions may be isotropically etched.

Still another example embodiment can be generally characterized as a method of fabricating a semiconductor device according to a method that includes forming an active pattern comprising first active regions and a second active region interposed between the first active regions, the active pattern protruding above a surface of a semiconductor substrate; forming a device isolation layer surrounding the active pattern; forming an etch mask pattern on the active pattern and the device isolation layer, the etch mask pattern comprising a slit crossing over the second active region; recessing a top portion of the second active region using the etch mask pattern as a mask to form a channel recess portion exposing opposing side walls of the first active regions; forming a sacrificial spacer on side walls of the etch mask pattern and side walls of the channel recess portion; and etching the device isolation layer using the etch mask pattern and the sacrificial spacer as a mask to form a groove exposing side walls of the recessed second active region in the device isolation layer.

The aforementioned method may further include, before or after forming the groove, further recessing the top portion of the recessed second active region using the etch mask pattern and the sacrificial spacer as a mask to form a channel trench portion extending from the channel recess portion.

According to the aforementioned method, the further recessing the top portion of the recessed second active region may include isotropically etching the recessed second active region to form the channel trench portion.

Still another example embodiment can be generally characterized as a method of fabricating a semiconductor device according to a method that includes forming an active pattern comprising first active regions and a second active region interposed between the first active regions, the active pattern protruding above a surface of a semiconductor substrate; forming a device isolation layer surrounding the active pattern; forming an etch mask pattern on the active pattern and the device isolation layer, the etch mask pattern comprising a slit crossing the second active region; forming a sacrificial spacer on side walls of the etch mask pattern; etching the device isolation layer using the etch mask pattern and the sacrificial spacer as a mask to form a groove exposing side walls of the second active region; removing the sacrificial spacer to expose the side walls of the etch mask pattern; and recessing a top portion of the second active region using the etch mask pattern having the exposed side walls as a mask to form a channel recess portion exposing opposing side walls of the first active regions, wherein a top surface of the recessed second active region protrudes above a bottom surface of the groove.

While the exemplary embodiments of the present invention have been particularly shown and described above, it will be understood by those of ordinary skill in the art that various changes in form and details may be made therein without departing from the spirit and scope of the present invention as defined by the following claims.

What is claimed is:

1. A semiconductor device comprising:
an active pattern comprising first active regions and a second active region interposed between the first active regions, wherein the active pattern protrudes above a surface of a semiconductor substrate and includes a channel recess portion above the second active region and between the first active regions;
a device isolation layer surrounding the active pattern and having a groove exposing side walls of the second active region, wherein a distance between opposing side walls of the first active regions exposed by the channel recess portion is greater than a distance between side walls of the groove; and
a gate pattern located in the channel recess portion and extending along the groove.

2. The semiconductor device of claim 1, wherein a distance between a central portion of a side wall of one of the first active regions and a central portion of a sidewall of another of the first active regions opposing the side wall of the one of the first active regions is greater than the distance between opposing side walls of the groove and wherein a distance between a side edge of the side wall of the one of the first active regions and a side edge of the side wall of the another of the first active regions is greater than or equal to the distance between the opposing side walls of the groove.

3. The semiconductor device of claim 1, wherein a distance between a central portion of a sidewall of one of the first active regions and a central portion of a sidewall of another of the first active regions opposing the sidewall of the one of the first active regions is less than a distance between a side edge of the side wall of the one of the first active regions and a side edge of the side wall of the another of the first active regions.

4. The semiconductor device of claim 1, wherein the active pattern further comprises a channel trench portion having a semi-spherically shaped base, the channel trench portion extending downwardly from the channel recess portion.

5. The semiconductor device of claim 1, wherein a top surface of the gate pattern protrudes above a top surface of at least one of the active pattern and the device isolation layer.

6. The semiconductor device of claim 1, wherein a top surface of the gate pattern is substantially coplanar with a top surface of at least one of the active pattern and the device isolation layer.

7. The semiconductor device of claim 6, wherein the gate pattern comprises:
a gate electrode; and
a capping pattern disposed on the gate electrode.

8. The semiconductor device of claim 1, wherein a top surface of the second active region protrudes above a bottom surface of the groove.

9. The semiconductor device of claim 1, further comprising source and drain regions formed in upper portions of the first active regions.

10. The semiconductor device of claim 9, wherein the source and drain regions define a channel region therebetween, wherein a channel width of the channel region is greater than a width of the second active region and wherein a channel length of the channel region is greater than the distance between the opposing side walls of the first active regions exposed by the channel recess portion.

11. The semiconductor device of claim 1, wherein a top surface of the second active region lies between a bottom surface of the groove and a top surface of the first active regions.

12. A semiconductor device comprising:
a semiconductor substrate;
an active pattern formed on a surface of the semiconductor substrate, wherein the active pattern comprises a first active region and a second active region;

a device isolation layer formed on the surface of the semiconductor substrate adjacent to the first active region and the second active region, wherein the device isolation layer includes a groove;

a gate electrode disposed between side walls of the groove, the gate electrode extending over a top surface of the second active region and adjacent to a side wall of the first active region; and a source/drain region formed in a top surface of the first active region, wherein a width of a portion of the gate electrode disposed between side walls of the groove is less than a width of a portion of the gate electrode extending over the top surface of the second active region and adjacent to the side wall of the first active region.

13. The semiconductor device of claim 12, wherein a bottom surface of a portion of the gate electrode is below the top surface of the second active region.

14. The semiconductor device of claim 12, wherein a width of a portion of the gate electrode extending over the top surface of the second active region is substantially constant over the top surface of the second active region.

15. The semiconductor device of claim 12, wherein a width of a portion of the gate electrode extending over the top surface of the second active region is variable over the top surface of the second active region.

16. A semiconductor device comprising:
a semiconductor substrate;
an active pattern formed on a surface of the semiconductor substrate, wherein the active pattern comprises:

a first active region having a first top surface above the surface of the semiconductor substrate and a first sidewall extending downwardly from the first top surface; and a second active region having a second top surface above the surface of the semiconductor substrate and a second sidewall extending downwardly from the second top surface, wherein the second top surface is below the first top surface;

a device isolation region adjacent to the active pattern; and a gate electrode within the device isolation region and over the active pattern, wherein the gate electrode extends along the second sidewall and the second top surface of the second active region and extends along the first sidewall of the first active region, wherein a width of a portion of the gate electrode within the device isolation region is less than a width of a portion of the gate electrode over the active pattern.

17. The semiconductor device of claim 16, further comprising a source/drain region in the first top surface of the first active region.

18. The semiconductor device of claim 17, further comprising a channel region disposed in the active pattern adjacent to the gate electrode and the source/drain region, wherein the channel region extends along the second sidewall and the second top surface of the second active region and extends along the first sidewall of the first active region.

* * * * *